US009910109B2

(12) United States Patent
Thielens et al.

(10) Patent No.: US 9,910,109 B2
(45) Date of Patent: Mar. 6, 2018

(54) PERSONAL RADIO-FREQUENCY ELECTROMAGNETIC RADIATION EXPOSIMETRY

(71) Applicant: UNIVERSITEIT GENT, Ghent (BE)

(72) Inventors: Arno Thielens, Antwerp (BE); Wout Joseph, Avelgem (BE); Luc Martens, De Pinte (BE)

(73) Assignee: UNIVERSITEIT GENT, Ghent (BE)

( * ) Notice: Subject to any disclaimer, the term of this patent is extended or adjusted under 35 U.S.C. 154(b) by 0 days.

(21) Appl. No.: 15/429,555

(22) Filed: Feb. 10, 2017

(65) Prior Publication Data

US 2017/0234943 A1 Aug. 17, 2017

Related U.S. Application Data

(63) Continuation-in-part of application No. 15/042,625, filed on Feb. 12, 2016.

(51) Int. Cl.
G01R 27/04 (2006.01)
G01R 33/12 (2006.01)
G01R 29/08 (2006.01)

(52) U.S. Cl.
CPC ......... *G01R 33/12* (2013.01); *G01R 29/0892* (2013.01)

(58) Field of Classification Search
CPC ........ G01P 3/486; G01P 3/4802; G01P 3/489; G01P 3/36; G01P 3/443; G01V 1/008;
(Continued)

(56) References Cited

U.S. PATENT DOCUMENTS 7,550,969 B2 * 6/2009 Zhdanov ................ A61B 5/417
324/232
9,407,309 B2 * 8/2016 Lee ........................ H04B 1/3838
(Continued)

OTHER PUBLICATIONS

Bamba, Aliou et al, "Experimental Assessment of Specific Absorption Rate Using Room Electromagnetics", IEEE Transactions on Electromagnetic Compatibility, vol. 54, No. 4, Aug. 2012. pp. 747-757.

(Continued)

*Primary Examiner* — Thang Le
(74) *Attorney, Agent, or Firm* — Justin Cassell; Workman Nydegger

(57) ABSTRACT

A method and system for determining a whole-body averaged specific absorption ratio ($SAR_{wb}$) in a person comprises positioning an exposimeter on the person's body and providing a chamber forming an electromagnetic (EM) cavity and comprising a radiofrequency emitter and receiver; determining a first reverberation time of decay of EM power and a free-space incident power density in the chamber when the person is absent, and determining, a second reverberation time of decay of EM power in the chamber and a reference received power, received by the exposimeter, when the person is present in the chamber; and determining an absorption cross section of the person taking the first and second reverberation time and a volume of the chamber into account, determining a calibration factor relating a received power on the exposimeter to the $SAR_{wb}$, measuring a received power using the exposimeter, and determining the $SAR_{wb}$ by applying the calibration factor.

20 Claims, 7 Drawing Sheets

(58) Field of Classification Search
CPC . G01V 3/082; G01V 3/12; G01V 3/06; G01R 29/0878; G01R 33/12; G01R 31/311; G01R 31/305; G01R 31/309; G01R 31/002; G01R 31/026; G01R 31/11; G01R 27/04; G01N 22/04; G01N 22/02; G01N 22/005
USPC .... 324/76.14, 469, 344, 501, 639, 642, 702, 324/175, 96, 629
See application file for complete search history.

(56) References Cited

U.S. PATENT DOCUMENTS

| | | | | |
|---|---|---|---|---|
| 2010/0149054 | A1* | 6/2010 | Hirata | G01R 29/0878 343/703 |
| 2011/0210735 | A1* | 9/2011 | Trakic | G01R 33/5659 324/309 |
| 2011/0267075 | A1* | 11/2011 | Woo | G01R 29/0857 324/629 |
| 2014/0157901 | A1* | 6/2014 | Emelianov | A61B 8/0841 73/606 |
| 2015/0323472 | A1* | 11/2015 | Lee | G01N 22/00 324/639 |

OTHER PUBLICATIONS

Thielens, Arno et al, "SARwb-meter in Diffuse Fields, Calibrated in a Reverberation Room", Ghent University/iMinds, Department of Information Technology, Ghent, Belgium. Presented at BIOMED2015, Monterey, CA, USA, Jun. 15, 2015, 6 Pages.

Andersen, Jorgen Bach, "Reverberation and Absorption in an Aircraft Cabin With the Impact of Passengers", IEEE Transactions on Antennas and Propagation, vol. 60, No. 5, May 2012. pp. 2472-2480.

Bamba, Aliou et al, "Validation of Experimental Whole-Body SAR Assessment Method in a Complex Indoor Environment", Bioelectromagnetics, vol. 34, 2013, pp. 122-132.

Bamba, Aliou et al, "Circuit Model for Diffuse Multipath and Electromagnetic Absorption Prediction in Rooms", IEEE Transactions on Antennas and Propagation, vol. 61, No. 6, Jun. 2013, pp. 3292-3301.

Bamba, Aliou et al. "Assessing Whole-Body Absorption Cross Section for Diffuse Exposure From Reverberation Chamber Measurements", IEEE Transactions on Electromagnetic Compatibility, vol. 57, No. 1, Feb. 2015, pp. 27-34.

Bamba, Aliou et al. "A Formula for Human Average Whole-Body SARwb under Diffuse Fields Exposure in the GHz Region", Physics in Medicine & Biology, vol. 59 (2014) pp. 7435-7456.

Bolte, John F.B. et al. "Personal Radiofrequency Electromagnetic Field Measurements in the Netherlands: Exposure level and Variability for Everyday Activities, Times of Day and Types of Area", Environment International, vol. 48, 2012, pp. 133-142.

Cisco Visual Networking Index: Global Mobile Data Traffic Forecast Update, 2015-2020, Cisco and/or its affiliates, Feb. 3, 2016, pp. 1-39.

Frei Patrizia et al. "Temporal and Spatial Variability of Personal Exposure to Radio Frequency Electromagnetic Fields", Environmental Research, vol. 109, 2009, pp. 779-785.

Andersen, J. Bach et al. "Room Electromagnetics", IEEE Antennas and Propagation Magazine, vol. 49, No. 2, Apr. 2007, pp. 27-33.

"Guidelines for Limiting Exposure to Time-Varying Electric, Magnetic, and Electromagnetic Fields (Up to 300 GHz)", ICNIRP Guidelines, International Commission on Non-Ionizing Radiation Protection, Health Physics Society, vol. 74, No. 4, Apr. 1998, pp. 494-522.

Joseph, Wout et al. "Comparison of Personal Radio Frequency Electromagnetic Field Exposure in Different Urban Areas Across Europe", Environmental Research, vol. 110, 2010, pp. 658-663.

Joseph, Wout et al. "Characterization of Personal RF Electromagnetic Field Exposure and Actual Absorption for the General Public", Health Physics Society, vol. 95, No. 3, Sep. 2008. pp. 317-330.

Joseph, Wout et al. "Estimation of Whole-Body SAR From Electromagnetic Fields Using Personal Exposure Meters", Bioelectromagnetics, vol. 31, 2010, pp. 286-295.

Joseph, Wout et al. "Between-Country Comparison of Whole-Body SAR From Personal Exposure Data in Urban Areas", Bioelectromagnetics, vol. 33, 2012, pp. 682-694.

Thielens, Arno, Assessment of Personal Exposure to Radio Frequency Radiation in Realistic Environments, Chapter 9: Conclusions and Future Research, Chapter from Doctoral Thesis, University Press. May 2015.

Roosli, Martin "Statistical Analysis of Personal Radiofrequency Electromagnetic Field Measurements with Nondetects", Bioelectromagnetics, vol. 29, 2008, pp. 471-478.

Thielens, Arno et al. "Whole-Body Averaged Specific Absorption Rate Estimation Using a Personal, Distributed Exposimeter", IEEE Antennas and Wireless Propagation Letters, vol. 14, 2015, pp. 1534-1537.

Deventer, Emilie van et al. "WHO Research Agenda for Radiofrequency Fields", Bioelectromagnetics, vol. 32, 2011, pp. 417-421.

"Who Research Agenda for Radiofrequency Fields", World Health Organization, 2010.

"Abstract Collection", BioEM2015, Jun. 14-19, 2015, Asilomar Conference Center, California USA, The annual Meeting of Bioelectromagnetics Society European Bioelectromagnetics Association, 569 Pages.

* cited by examiner

PERSONAL RADIO-FREQUENCY ELECTROMAGNETIC RADIATION EXPOSIMETRY

FIELD OF THE INVENTION

The invention relates to the field of personal exposure measurement of exposure to radio-frequency electromagnetic radiation. More specifically, it relates to a method and system for determining a whole-body averaged specific absorption ratio of absorbed radio-frequency electromagnetic radiation.

BACKGROUND OF THE INVENTION

The rate at which radio-frequency (RF) electromagnetic (E-M) energy is absorbed by the human body can be quantified by the specific absorption rate (SAR). This SAR can be expressed as the power absorbed per unit of mass tissue, e.g. expressed in units of watts per kilogram. Even though in particular applications, SAR is used in relation to the absorption of different energy qualities, such as energy conveyed by ultrasound, the present disclosure relates to SAR as a measure of the absorption rate of RF electromagnetic energy specifically. SAR measures can, for example, be used to determine whether emissions from RF sources, such as mobile phones, magnetic resonance imaging scanners or microwave ovens, are within safety tolerance levels.

A distinction can be made between the whole-body averaged SAR ($SAR_{wb}$) and a local measure of SAR, such as SAR over a small sample volume of tissue, for example over 1 g or 10 g of tissue. A whole-body averaged SAR measure may, for example, be particularly suitable for expressing the influence of a relatively uniform RF E-M exposure.

It is known in the art that the number of man-made RF sources, and the transmitted RF energy density in occupied areas, has steadily increased over time in the past, and can be expected to increase further in at least the near future. Furthermore, possible adverse effects of absorbed RF energy in the human body may have given rise to a public concern. For example, dielectric heating of tissues due to absorption of radio-frequency electromagnetic fields in the human body is a known health effect. Furthermore, the equations known in the art to describe such heating may typically use the SAR as an input parameter. Therefore, the SAR has been implemented as a test measure for defining basic restrictions on RF E-M radiation exposure. Particularly, restrictions on the allowable $SAR_{wb}$ have been imposed in many jurisdictions.

However, it may be difficult, or even impossible, to accurately measure the specific absorption ratio in tissue inside a living human. Therefore, reference levels have also been defined on the incident electromagnetic fields, as studied in the field of personal exposure assessment.

For example, it is known in the art to assess personal exposure by registering electric field strengths using personal exposimeters (PEM), e.g. devices that can be worn on the body to measure time-varying electric-field strengths in different frequency bands of interest. It is an advantage that such exposimeters can be worn and used by subjects without requiring an extensive training. The use of such devices is widespread. For example, exposimeters may be used by both scientists and RF workers, e.g. workers installing RF antennas or performing maintenance on RF antennas. However, exposimeters as known in the art may have various disadvantages, e.g. large measurement uncertainties. Particularly, an important disadvantage is that electric fields are measured, which only serve as a proxy for $SAR_{wb}$-values. Even though methods are known in the art to measure $SAR_{wb}$ for a controlled source in an indoor environment, such methods may require a fixed set-up using off-body antennas and may only determine the absorption of a predetermined controlled emitted signal. Particularly, the $SAR_{wb}$ of ambient radiation, e.g. of uncontrolled sources, may not be measurable by using such techniques.

Various methods are known in the art for performing a standardized measurement of averaged SAR values, e.g. 1 g or 10 g averaged SAR values, using a standardized phantom or human body model, e.g. an anthropomorphic phantom, to assess SAR values, such as the ESM-120 (Maschek, Germany), DASY (SPEAG, Switzerland), cSAR3D (SPEAG, Switzerland) and iSAR (SPEAG, Switzerland) systems. However, most of such methods known in the art are adapted for providing 1 g or 10 g averaged SAR values.

Specific numerical tools are known in the art, such as SEMCAD-X (SPEAG, Switzerland) and Sim4Life (SPEAG, Switzerland), that allow one to use numerical human body models in order to provide $SAR_{wb}$-values. For example, such numerical methods may use an MRI model of a specific subject. However, to achieve a highly specific estimate of $SAR_{wb}$ for a particular human subject, such methods would also require a detailed measurement of the subject's dielectric properties, which may not be possible in living humans using methods known in the art.

Another approach for the determination of $SAR_{wb}$ uses the concept of 'room electromagnetics', a theory which studies the propagation and absorption of electromagnetic fields using methods from room acoustics. This theory established a relationship between the reverberation time, a time constant of the decay of electromagnetic power in a room, and the electromagnetic radiation absorption in a room. For example, Bamba et al. disclosed an application of room electromagnetics for determining $SAR_{wb}$ in "Experimental Assessment of Specific Absorption Rate Using Room Electromagnetics," IEEE Transactions on Electromagnetic Compatibility, 54(4), pp. 747-757. However, such approach requires knowledge of the incident power density without the subject present, which cannot be directly determined when the monitored person is present.

SUMMARY OF THE INVENTION

It is an object of embodiments of the present invention to enable the measurement of $SAR_{wb}$ in a human subject caused by ambient RF radiation using on-body antennas, It is an advantage of embodiments of the present invention that an efficient and accurate personal $SAR_{wb}$ measurement is provided.

It is an advantage of embodiments of the present invention that a $SAR_{wb}$ measurement value can be determined using a personal $SAR_{wb}$-meter.

It is an advantage of embodiments of the present invention that a $SAR_{wb}$-meter is provided that can measure a $SAR_{wb}$ value that is specific to the person wearing the device.

It is an advantage of embodiments according to the present invention that a whole body averaged specific absorption ratio can be accurately determined in a person-specific manner. It is a further advantage that such $SAR_{wb}$ can be determined in a person-specific manner in real-time.

It is an advantage of embodiments according to the present invention that an exposimeter can be calibrated to determine a whole-body averaged specific absorption ratio without requiring numerical simulation taking physical properties and geometry of the subject's body into account.

It is an advantage of embodiments according to the present invention that a whole body averaged specific absorption ratio of a person due to exposure to a diffuse radio-frequency electromagnetic radiation field can be accurately determined.

It is an advantage of embodiments according to the present invention that numerical simulations and experimental measurements in anthropomorphic phantom models are not required to determine the $SAR_{wb}$. It is a further advantage that the $SAR_{wb}$ can be determined in a person-specific manner.

It is an advantage of embodiments according to the present invention that a portable, e.g. wearable or handheld, exposimeter can be used to determine $SAR_{wb}$.

It is an advantage of embodiments according to the present invention that an off-body antenna configuration is only required during calibration of an exposimeter, and not during use, in which the $SAR_{wb}$ of a person is determined under uncontrolled conditions.

It is an advantage of embodiments according to the present invention that a simple and inexpensive off-body antenna configuration can be used for calibration. It is a further advantage that this off-body antenna configuration can be re-used for calibrating further exposimeters while an earlier calibrated exposimeter is used.

The above objective is accomplished by a method and device according to the present invention.

In a first aspect, the present invention relates to a method for determining a whole-body averaged specific absorption ratio of absorbed radio-frequency electromagnetic radiation in a person. The method comprises positioning an exposimeter comprising at least one radiofrequency antenna on the body of the person, and providing a chamber forming an electromagnetic cavity, e.g. a closed chamber forming an electromagnetic cavity. The chamber comprises at least one radiofrequency emitter and at least one radiofrequency receiver. The method further comprises determining a first reverberation time representative of a first decay of electromagnetic power and a free-space incident power density in the chamber when the person is absent from the chamber, in which this determination is performed by a processor receiving the electromagnetic power as function of time and/or frequency. The electromagnetic power is detected and transmitted as a first signal to the processor by the radiofrequency receiver in response to a first radiofrequency emission of the radiofrequency emitter when the person is absent from the chamber. The method further comprises determining, using the processor, a second reverberation time representative of a second decay of the electromagnetic power in the chamber and simultaneously determining a reference received power received by the radiofrequency antenna of the exposimeter when the person is present in the chamber. This electromagnetic power is detected and transmitted as a second signal to the processor by the radiofrequency receiver in response to a second radiofrequency emission by the radiofrequency emitter when the person is present in the chamber.

The method further comprises determining, using the processor, an absorption cross section of the person taking the first reverberation time, the second reverberation time and a predetermined volume of the chamber into account, and determining, using the processor, a calibration factor and storing the calibration factor in a memory. The calibration factor relates a received power on the radiofrequency antenna of the exposimeter to the whole-body averaged specific absorption ratio of absorbed radio-frequency electromagnetic radiation in the person. The method further comprises measuring a received power on the radiofrequency antenna of the exposimeter and determining the whole-body averaged specific absorption ratio of absorbed radio-frequency electromagnetic radiation in the person by applying the calibration factor. Determining the calibration factor takes the reference received power, the incident power density, the absorption cross section and a predetermined mass of the person into account.

In a method according to embodiments of the present invention, providing the chamber may comprise arranging both the radiofrequency emitter and the radiofrequency receiver in the far-field of the location where the person will be present in said chamber. Or alternatively formulated, the person may be present in the room, when determining the second reverberation time and the reference received power, at a position such that both the radiofrequency emitter and the radiofrequency receiver are located in the far-field of the position of the person.

In a method according to embodiments of the present invention, providing the chamber may comprise arranging the radiofrequency receiver in the far field of radiofrequency electromagnetic radiation emission of the emitter.

In a method according to embodiments of the present invention, determining the calibration factor may comprise determining an on-body antenna aperture as a ratio of the reference received power over the incident power density, in which the calibration factor is determined as a ratio of a product of the on-body antenna aperture and the predetermined mass over the absorption cross section.

In a method according to embodiments of the present invention, determining the whole-body averaged specific absorption ratio of absorbed radio-frequency electromagnetic radiation in the person may comprise dividing the received power by the calibration factor.

In a method according to embodiments of the present invention, the absorption cross section may be determined by calculating the difference of the inverse of the second reverberation time and the inverse of the first reverberation time, wherein the difference is multiplied by the predetermined volume and divided by a speed of propagation of electromagnetic radiation in the chamber.

In a method according to embodiments of the present invention, the first reverberation time and/or the second reverberation time may be determined as an inverse of a slope of a logarithm of the electromagnetic power detected by the radiofrequency receiver with respect to time, in which the inverse is multiplied by a constant factor.

In a method according to embodiments of the present invention, this constant factor may be equal to minus ten divided by the natural logarithm of ten when the electromagnetic power is expressed in a decibel scale, e.g. when said logarithm of said electromagnetic power corresponds to a decibel scale of said electromagnetic power.

In a method according to embodiments of the present invention, measuring the received power on the radiofrequency antenna of the exposimeter may comprise measuring the received power in an uncontrolled environment outside the chamber.

A method according to embodiments of the present invention may further comprise storing the determined whole-body averaged specific absorption ratio in a memory integrated in the exposimeter.

A method according to embodiments of the present invention may further comprise displaying the determined whole-body averaged specific absorption ratio on a display integrated in the exposimeter.

In a second aspect, the present invention relates to a system for determining a whole-body averaged specific absorption ratio of absorbed radio-frequency electromagnetic radiation in a person. The system comprises an exposimeter that comprises a radiofrequency antenna for positioning on the body of the person. The system comprises at least one radiofrequency emitter and at least one radiofrequency receiver for installing in a chamber forming an electromagnetic cavity. The system further comprises a processor configured for receiving an electromagnetic power as function of time and/or frequency from the radiofrequency receiver when installed in the chamber, and for obtaining a reference received power from the radiofrequency antenna of the exposimeter. The system also comprises a memory.

The processor is programmed for determining a first reverberation time representative of a first decay of electromagnetic power and a free-space incident power density in the chamber when the person is absent from the chamber. The electromagnetic power is detected by the radiofrequency receiver in response to a radiofrequency emission by the radiofrequency emitter when the person is absent from the chamber.

The processor is further programmed for determining a second reverberation time representative of a second decay of the electromagnetic power in the chamber and simultaneously determining the reference received power received by the radiofrequency antenna of the exposimeter when the person is present in the chamber. The electromagnetic power is detected by the radiofrequency receiver in response to a radiofrequency emission by the radiofrequency emitter when the person is present in the chamber.

The processor is further programmed for determining an absorption cross section of the person taking the first reverberation time, the second reverberation time and a predetermined volume of the chamber into account, and the processor is programmed for determining a calibration factor, e.g. representative of an electromagnetic mass of the person, and storing the calibration factor in the memory. The calibration factor is representative of, e.g. may express, a ratio of a received power on the radiofrequency antenna of the exposimeter and the whole-body averaged specific absorption ratio of absorbed radio-frequency electromagnetic radiation in the person. Determining the calibration factor takes the reference received power, the incident power density, the absorption cross section and a predetermined mass of the person into account.

The processor is programmed for measuring a received power on the radiofrequency antenna of the exposimeter and determining the whole-body averaged specific absorption ratio of absorbed radio-frequency electromagnetic radiation in the person by applying the calibration factor.

In a system according to embodiments of the present invention, the radiofrequency antenna of the exposimeter may comprise a textile antenna, a printed antenna, e.g. printed on textile or another carrier material, and/or an antenna compatible with printed circuit boards (PCB), and/or a flexible circuit antenna, and/or an antenna integrated in a surface mounted device (SMD)

In a system according to embodiments of the present invention, the exposimeter may further comprise receiver electronics, e.g. wearable receiver electronics, for measuring and/or processing and/or storing the received power and/or communicating with the processor.

A system according to embodiments of the present invention may furthermore comprise the chamber having the radiofrequency emitter and the radiofrequency receiver installed therein. The radiofrequency receiver may be arranged in the far field of radiofrequency electromagnetic radiation emission of the emitter.

In a system according to embodiments of the present invention, the processor may be programmed for determining an antenna aperture as a ratio of the reference received power over the incident power density, and for determining the calibration factor as a ratio of a product of the antenna aperture and the predetermined mass over the absorption cross section.

A system according to embodiments of the present invention may further comprise an input device for receiving the predetermined mass and the predetermined volume as input and storing the input in the memory.

In a system according to embodiments of the present invention, the processor may be programmed for determining the whole-body averaged specific absorption ratio of absorbed radio-frequency electromagnetic radiation in the person by dividing the received power by the calibration factor.

In a system according to embodiments of the present invention, the processor is programmed for determining the absorption cross section as the difference of the inverse of the second reverberation time and the inverse of the first reverberation time, wherein the difference is multiplied by the predetermined volume and divided by a speed of propagation of electromagnetic radiation in the chamber, e.g. the speed of light.

In a system according to embodiments of the present invention, the processor may be programmed for determining the first reverberation time and/or the second reverberation time as an inverse of a slope of a logarithm of electromagnetic power detected by the radiofrequency receiver with respect to time, in which this inverse is multiplied by a constant factor.

In a system according to embodiments of the present invention, the processor may comprise at least one processing unit integrated in the exposimeter.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

Figure 1:
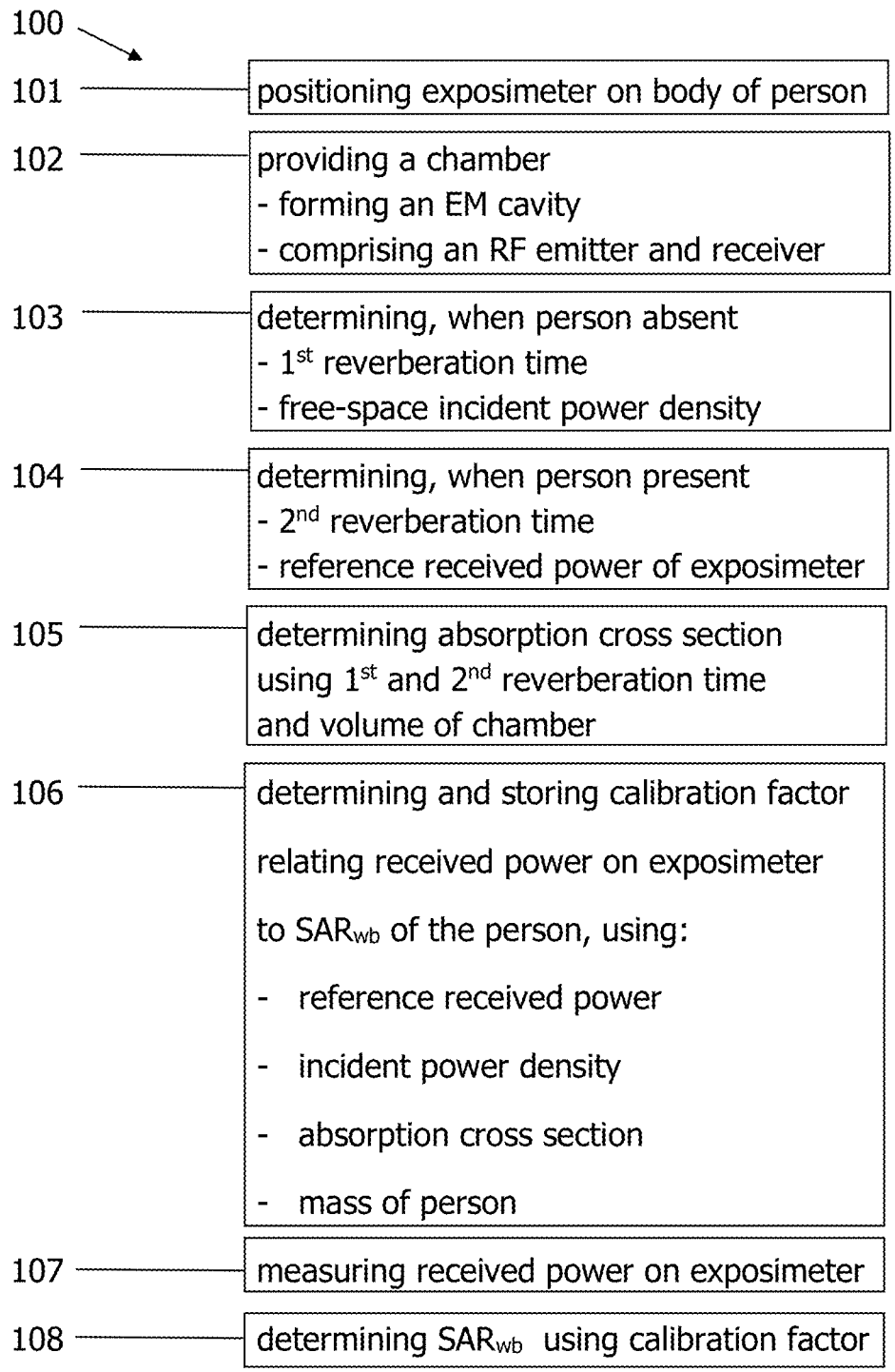
FIG. 1 illustrates an exemplary method according to embodiments of the present invention.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

In a first aspect, the present invention relates to a method for determining a whole-body averaged specific absorption ratio ($SAR_{wb}$) of absorbed radio-frequency electromagnetic radiation in a person. The method comprises positioning an exposimeter comprising at least one radiofrequency antenna on the body of the person. The method further comprises providing a chamber, e.g. a closed chamber, that forms an electromagnetic cavity. This chamber comprises at least one radiofrequency emitter and at least one radiofrequency receiver.

The method further comprises determining a first reverberation time representative of a first decay of electromagnetic power and a free-space incident power density in the chamber when the person is absent from the chamber. This step of determining the first reverberation time is performed by a processor receiving the electromagnetic power as function of time and/or frequency. This electromagnetic power is detected and transmitted as a first signal to the processor by the radiofrequency receiver in response to a first radiofrequency emission of the radiofrequency emitter when the person is absent from the chamber.

The method further comprises determining, using the processor, a second reverberation time representative of a second decay of electromagnetic power in the chamber and simultaneously determining a reference received power received by the radiofrequency antenna of the exposimeter when the person is present in the chamber. This electromagnetic power is detected and transmitted as a second signal to the processor by the radiofrequency receiver in response to a second radiofrequency emission by the radiofrequency emitter when the person is present in the chamber, The method further comprises determining, using the processor, an absorption cross section of the person taking the first reverberation time, the second reverberation time and a predetermined volume of the chamber into account. The method also comprises determining a calibration factor using the processor, and storing this calibration factor in a memory. This calibration factor relates a received power on the radiofrequency antenna of the exposimeter to the whole-body averaged specific absorption ratio of absorbed radio-frequency electromagnetic radiation in the person. Furthermore, determining this calibration factor takes the reference received power, the incident power density, the absorption cross section and a predetermined mass of the person into account.

The method also comprises measuring a received power on the radiofrequency antenna of the exposimeter, and determining the whole-body averaged specific absorption ratio of absorbed radio-frequency electromagnetic radiation in the person by applying the calibration factor.

Referring to FIG. 1, an exemplary method 100 according to embodiments of the present invention is illustrated. This method 100 is a method for determining a whole-body averaged specific absorption ratio ($SAR_{wb}$) of absorbed radio-frequency electromagnetic radiation in a person, e.g. for determining such $SAR_{wb}$ on the body of the person, e.g. using a wearable exposimeter.

References to radio-frequency electromagnetic radiation may refer to electromagnetic radiation in a specific wavelength band of interest, e.g. related to mobile phone radiofrequency communication. For example, the emitter described hereinbelow may emit RF EM radiation at a predetermined frequency or in a predetermined band of interest, the receiver described hereinbelow may be adapted for isolating this frequency or band of interest, and, likewise, the radiofrequency antenna of the exposimeter may also be adapted for isolating this frequency or band of interest. Such band of interest may be relatively narrow or rather wide. As known in the art, the predetermined frequency or frequency band of interest of the receiver, emitter and/or RF antenna of the exposimeter may be fixed or adjustable, e.g. tunable. Furthermore, embodiments of the present invention may relate to a method in which the described measurements and calculations are performed for a plurality of predetermined wavelength bands, e.g. such as to assess $SAR_{wb}$ in a plurality of wavelength regions or even to spectrally sample the $SAR_{wb}$. It shall also be clear that multiple frequencies or frequency bands may be analysed simultaneously, e.g. references to radiation-related quantities hereinbelow are not necessarily to be interpreted as scalar values, but may also relate to vector values having a plurality of frequency components.

For example, an RF frequency band used for telecommunication purposes may be analysed, or a combination of such RF frequency bands may be analysed simultaneously. The table provided hereinbelow lists such commonly used bands for telecommunication purposes and candidate ranges for future communication technology, without embodiments of the invention being intended to be limited by such exemplary frequency bands. It shall be clear that a suitable frequency range can be selected by the person of ordinary skill in the art without any inventive effort in view of a particular application or in consideration of expected exposure conditions of a person to be monitored in the field.

For example, multiple frequency bands may be analysed simultaneously, in accordance with embodiments of the present invention, e.g. by applying a method or using a system according to embodiments to determine a $SAR_{wb}$ value per band and a cumulative $SAR_{wb}$ value.

| RF technology | exemplary ranges (GHz) |
| --- | --- |
| FM Radio | 0.0875-0.108, 0.087-0.107 |
| TV3 | 0.174-0.223 |
| TETRA I | 0.380-0.400 |
| TETRA II | 0.410-0.430 |
| TETRA III | 0.450-0.70 |
| DVB-T | 0.470-0.790 |
| DL-800* | 0.791-0.821 |
| UL-800* | 0.832-0.862 |
| UL-900* | 0.880-0.915 |
| DL-900* | 0.925-0.960 |
| UL-1800* | 1.710-1.785 |
| DL-1800* | 1.805-1.880 |
| DECT | 1.880-1.900 |
| UL-1900* | 1.920-1.980 |
| DL-1900* | 2.110-2.170 |
| Wifi-2G | 2.400-2.485 |
| UL-2600* | 2.500-2.570 |
| DL-2600* | 2.620-2.690 |
| WiMax 3.5 | 3.300-3.900, 3.400-3.600 |
| Wifi-5G | 5.150-5.880, 5.150-5.875 |
| UWB | 3.0-10.0, 3.1-10.6 |
| 5G | 28-30 |
| (future networks) | 57-66 |
| | 67-74 |
| | 28-100 |
| | 28-300 |
| | 56-100 |
| | 56-300 |
| | 57-64 |
| | 59-66 |
| | 59.4-62.9 |

*Some technologies are identified in technology neutral terms in the table hereinabove, since particular technologies known in the art, e.g. LTE, GSM or UMTS technology, may not be restricted to single technology-specific frequency bands.

The method 100 comprises positioning 101 an exposimeter on the body of the person. This exposimeter comprises at least one radiofrequency antenna. The exposimeter may comprise one radiofrequency antenna, or may comprise a plurality of radiofrequency antennas. Furthermore, in embodiments according to the present invention, a plurality of exposimeters may be positioned on the body of the person, e.g. each exposimeter comprising at least one radiofrequency antenna. In accordance with embodiments of the present invention, each radiofrequency antenna may be calibrated as described hereinbelow, e.g. acquiring a reference received power for each antenna and using this reference received power to determine a calibration factor specific to each antenna, or, alternatively, the power received by the plurality of antennas may be averaged and a calibration factor may be determined for this averaged received power.

The method 100 further comprises providing 102 a chamber, e.g. a substantially closed chamber, e.g. a closed chamber. This chamber forms an electromagnetic cavity. The provided chamber comprises at least one radiofrequency emitter and at least one radiofrequency receiver. For example, the chamber with emitter(s) and receiver(s) may form an off-body radiofrequency testing setup. For example, the method may comprise providing a radiofrequency emitter/receiver system in the chamber.

For example, the chamber that is provided may comprise an antenna, e.g. a single antenna, configured for emitting and receiving radiofrequency electromagnetic radiation. Thus, such antenna may comprise electronics for switching between an emitter mode and receiver mode. For example, a first reflection of an emitted signal may be received at a time delay with respect to the emission in the range of 0.5 ns to 200 ns, e.g. 0.5 ns to 50 ns, e.g. 1 ns to 20 ns, e.g. 1 ns to 10 ns, e.g. of the order nanoseconds. In an example, if the emitter and receiver are placed at a distance of 0.5 m from a radiofrequency reflective surface, a first reflection may appear after 3.3 ns.

In accordance with embodiments of the present invention, the antenna may comprise switching electronics for switching from an emitter mode to a receiver mode, e.g. for switching in a time interval less than 1 ns.

In embodiments according to the present invention, the chamber that is provided may comprise a plurality of antennas, e.g. two antennas, in which each antenna is configured for emitting and receiving radiofrequency electromagnetic radiation. Thus, electronics may be provided for switching each antenna between an emitter mode and receiver mode, e.g. for switching a first antenna to a receiver mode while switching the second antenna to an emitter mode, and for switching the first antenna to an emitter mode while switching the second antenna to a receiver mode.

In embodiments according to the present invention, the chamber that is provided may comprise a first antenna configured for emitting radiofrequency electromagnetic radiation, and a second antenna configured for receiving radiofrequency electromagnetic radiation, e.g. for receiving a reflection in the chamber of the emitted radiation.

In embodiments according to the present invention, the chamber that is provided may comprise a plurality of transmitter antennas and a plurality of receiver antennas. For example, a plurality of emitter and/or receiver antennas can be integrated in a single device, e.g. in a multiple-input multiple-output (MIMO) configuration.

In embodiments according to the present invention, providing the chamber may comprise providing means for creating diversity in the propagation of diffuse radiofrequency electromagnetic modes in the chamber. For example, an electromagnetic stirrer may be provided to ensure that different diffuse modes in the cavity formed by the chamber are excited. For example, the transmitter antenna(s) and/or receiver antenna(s) may be rotated during execution of the method to induce channel diversity. Likewise, a plurality of transmitter antennas and/or receiver antennas may be provided to promote diversity. Nevertheless, such means for creating diversity in the propagation of diffuse modes may not be required, as diffuse radiofrequency electromagnetic fields may propagate in the chamber without requiring such optimization, even though embodiments providing such measures for generating field diversity may be advantageous.

In embodiments according to the present invention, providing the chamber may comprise arranging both the radiofrequency emitter and the radiofrequency receiver in the far-field of the volume the person will occupy when the person will be present in the chamber.

In embodiments according to the present invention, providing the chamber may comprise arranging the radiofrequency receiver in the far field of radiofrequency electromagnetic radiation emission of the emitter.

The method 100 further comprises determining 103 a first reverberation time $\tau_0$ representative of a first decay of electromagnetic power, e.g. a first decay of a first electromagnetic power, in the chamber when the person is absent from the chamber, and determining, e.g. simultaneously determining, a free-space incident power density $S_{inc}$, in the chamber when the person is absent from the chamber.

For example, in embodiments according to the present invention, where a means for creating diversity in the propagation of diffuse radiofrequency electromagnetic modes in the chamber is provided, it may be preferable, though not necessary, to synchronize the free-space measurements, e.g. the first reverberation time $\tau_0$ and the free-space incident power density $S_{inc}$, may be simultaneously determined. Where no such diversity creating means are provided, and the empty chamber may be considered a static environment, it may be preferable, although not necessary, to determine these measurements separately.

This step of determining the first reverberation time is performed by a processor receiving the electromagnetic power as function of time and/or frequency. This electromagnetic power is furthermore detected, and transmitted as a first signal to the processor, by the radiofrequency receiver in response to a first radiofrequency emission of the radiofrequency emitter when the person is absent from the chamber.

The free-space incident power density in the chamber, when the person is absent from the chamber, may be determined from measurement data received from the radiofrequency receiver. However, the free-space incident power density in the chamber, when the person is absent from the chamber, may also be determined from measurement data received from a separate broadband antenna, an antenna other than the radiofrequency receiver. For example, this separate broadband antenna may be positioned near, e.g. at, the intended position of the person when present in the chamber. However, even though such positioning may be advantageous, it is only optional, since for a diffuse electromagnetic radiation field in the room, e.g. caused by an emission of the radiofrequency emitter and sufficiently diffused throughout the chamber by radiofrequency electromagnetic radiation reflection off surfaces, e.g. off walls of the chamber, and optionally assisted by additional means for creating diversity in propagation modes, a constant free-space incident power density over the volume of the chamber may be a suitable approximation. Furthermore, regardless of whether a separate antenna is used or the radiofrequency receiver is used to determine the free-space incident power density, embodiments of the present invention may also comprise determining the distances between the radiofrequency transmitter, the antenna used for free-space incident power density measurement and the intended position of the person in the chamber, to improve the determination of the free-space incident power density, e.g. by applying a location dependent model of free-space incident power density to infer the free-space incident power density at the position where the person will be present in the chamber from the measurement performed at the position of the antenna.

The free-space incident power density may be determined by the processor, e.g. by processing measurement data received from a radiofrequency antenna in the chamber for determining the free-space incident power density, e.g. received from the radiofrequency receiver. For example, an antenna aperture $AA_0$ of the radiofrequency antenna may be predetermined, e.g. stored in a memory accessible by the processor. Thus, the electromagnetic power $P_{r,0}$ received by the receiver, e.g. determined by the processor from the first signal, may be used to determine the free-space incident power density, e.g. using the relation $S_{inc}=P_{r,0}/AA_0$. This free-space incident power density may be assumed to be substantially uniform over the volume of the chamber, insofar the electromagnetic radiation field in the chamber is diffuse, e.g. the field that is emitted by the emitter and that is propagating in the cavity, formed by the chamber, is diffuse. Note that, hereinabove, $P_{r,0}$ and $AA_0$ refer to an electromagnetic radiofrequency power received by the receiver and an antenna aperture of this receiver in the chamber, whereas $P_r$ and AA, hereinbelow, refer to a received power received by the radiofrequency antenna of the exposimeter and the corresponding antenna aperture of this RF antenna of the exposimeter.

The method may also comprise emitting the first radiofrequency emission by the radiofrequency emitter when the person is absent from the chamber. For example, the radiofrequency emitter may receive a control signal from the processor to instruct the emitter to emit the first radiofrequency emission.

The method further comprises determining 104 a second reverberation time $\tau_1$ representative of a second decay of electromagnetic power, e.g. a second decay of a second electromagnetic power, in the chamber when the person is present in the chamber, and simultaneously determining a reference received power $P_r$ received by the radiofrequency antenna of the exposimeter when the person is present in the chamber. This step of determining the second reverberation time is performed by the processor, which may receive the electromagnetic power as function of time and/or frequency. This electromagnetic power is likewise detected, and transmitted as a second signal to the processor, by the radiofrequency receiver in response to a second radiofrequency emission by the radiofrequency emitter when the person is present in the chamber.

The method may thus also comprise emitting the second radiofrequency emission by the radiofrequency emitter when the person is present in the chamber. For example, the radiofrequency emitter may receive a control signal from the processor to instruct the emitter to emit the second radiofrequency emission.

Determining the first reverberation time and/or the second reverberation time may comprise determining a plurality of such first reverberation times and/or second reverberation times, e.g. using a plurality of transmitters and/or receivers in the chamber, and calculating a representative summary statistic of the first reverberation time and/or the second reverberation time respectively. Such representative summary statistic, which may be considered as the 'first reverberation time', respectively 'the second reverberation time' in the steps further described hereinbelow for embodiments that use such plurality of first reverberation times and/or second reverberation times, may for example be an average, a median, a mode, or a similar statistical measure of centrality. It is an advantage of such embodiments that a more robust measurement of reverberation time in the presence and/or the absence of the person can be obtained.

The method further comprises determining 105, using the processor, an absorption cross section $ACS_{subj}$ of the person, in which this determining takes the first reverberation time, the second reverberation time and a predetermined volume V of the chamber into account.

For example, the absorption cross section $ACS_0$ of the chamber with the person absent, e.g. of the empty room, may be determined using the mathematical relationship:

$$\tau_0 = \frac{V}{ACS_0 \cdot c},$$

in which c represents a speed of propagation of the electromagnetic radiation, e.g. the speed of light. The absorption cross section $ACS_1$ of the chamber with the person present, e.g. of the room with the subject, may be determined using the mathematical relationship:

$$\tau_1 = \frac{V}{ACS_1 \cdot c}.$$

Then, the absorption cross section $ACS_{subj}$ may be determined as a difference of the absorption cross section of the chamber with the person present and the absorption cross section of the chamber with the person absent, e.g. $ACS_{subj}=ACS_1-ACS_0$. It shall be clear that these mathematical expressions can be combined to obtain the absorption cross section of the person without explicitly computing the absorption cross section of the room with the person present and/or absent, e.g:

$$ACS_{subj} = \frac{V}{c}(\tau_1^{-1} - \tau_0^{-1}).$$

Thus, in embodiments according to the present invention, the absorption cross section $ACS_{subj}$ may be determined by calculating the difference of the inverse of the second reverberation time and the inverse of the first reverberation time, wherein the difference is multiplied by the predetermined volume and divided by a speed of propagation of electromagnetic radiation in the chamber, e.g. the speed of light, e.g. to obtain the absorption cross section of the person as the result of this multiplication and division.

In embodiments according to the present invention, the first reverberation time may be determined by calculating an inverse of a slope of a logarithm of the electromagnetic power detected by the radiofrequency receiver with respect to time, and multiplying this inverse by a constant factor, for example using the expression $\tau_0=-10 \log(e)/slope_0$, where $slope_0$ is the slope, e.g. the slope parameter of a linear fit, of the electromagnetic power, which was detected in the chamber when the person was absent from the chamber, as function of time, in which the electromagnetic power is expressed on a dB scale. Thus, this constant factor may be equal to minus ten divided by the natural logarithm of ten, or equivalently minus ten times the base-10 logarithm of Euler's constant, when the electromagnetic power is expressed in a decibel scale, e.g. when said logarithm of said electromagnetic power corresponds to a decibel scale of said electromagnetic power.

Alternatively, the first reverberation time may be calculated from the electromagnetic power as function of frequency, e.g. by applying an inverse Fourier transform to transform the power to a function in the time domain.

In embodiments according to the present invention, the second reverberation time may be determined by calculating an inverse of a slope of a logarithm of the electromagnetic power detected by the radiofrequency receiver with respect to time, and multiplying this inverse by a constant factor, for example using the expression $\tau_1=-10 \log(e)/slope_1$, where $slope_1$ is the slope, e.g. the slope parameter of a linear fit, of the electromagnetic power, which was detected in the chamber when the person was present in the chamber, as function of time, and in which the electromagnetic power is expressed on a dB scale. Thus, this constant factor may be equal to minus ten divided by the natural logarithm of ten, or equivalently minus ten times the base-10 logarithm of Euler's constant, when said logarithm of said electromagnetic power corresponds to a decibel scale of said electromagnetic power, e.g. the electromagnetic power is expressed in a decibel scale. Alternatively, the second reverberation time may be calculated from the electromagnetic power as function of frequency, e.g. by applying an inverse Fourier transform to transform the power to a function in the time domain.

Figure 3:
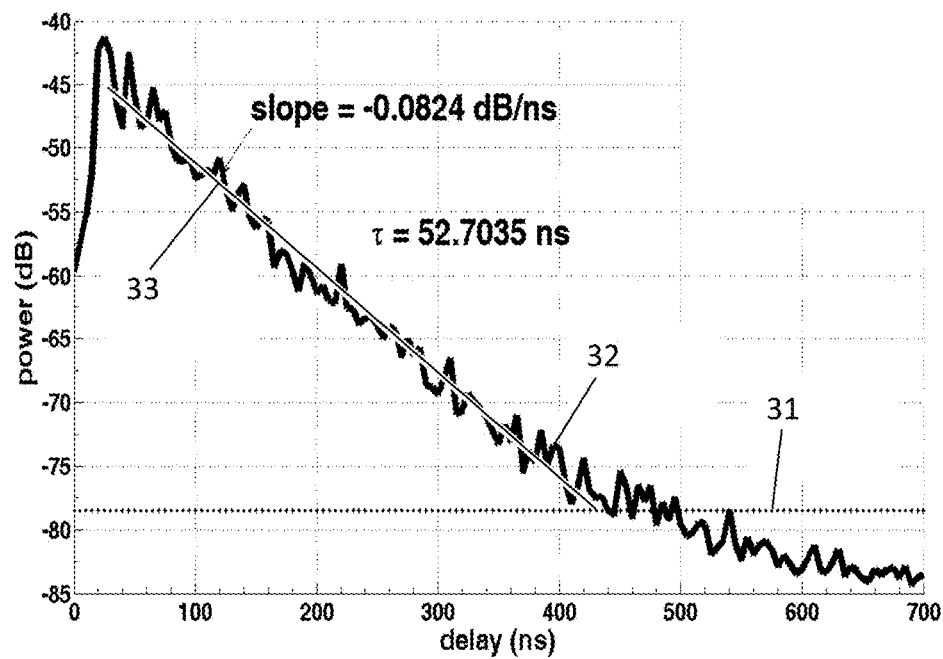
FIG. 3 shows an example of a reverberation time determined by using a slope of a linear fit in accordance with embodiments of the present invention.

For example, the determination of a reverberation time using such slope of a linear fit is illustrated in FIG. 3, showing a noise floor 31, measurement data 32 of measured power as function of delay time with respect to the E-M emission time, and a linear fit 33, from which a slope and the corresponding reverberation time are derived. In embodiments, data below a noise threshold may be excluded to improve a linear fit. However, in embodiments according to the present invention, other noise reduction and/or fitting techniques that are known in the art may be applied as well.

The method also comprises a step of determining 106 a calibration factor $M_e$ using the processor, and storing this calibration factor in a memory. The calibration factor relates a received power on the radiofrequency antenna of the exposimeter to the whole-body averaged specific absorption ratio of absorbed radio-frequency electromagnetic radiation in the person. Determining the calibration factor furthermore takes the reference received power, the incident power density, the absorption cross section and a predetermined mass M of the person into account.

Determining 106 the calibration factor may comprise determining an antenna aperture AA, e.g. determining an on-body antenna aperture, e.g. an antenna aperture of the radiofrequency antenna of the exposimeter while positioned on the body of the person, as a ratio of the reference received power over the incident power density, e.g. using the relation: $AA=P_r/S_{inc}$. The calibration factor $M_e$ may then be determined as a ratio of a product of the antenna aperture AA and the predetermined mass over the absorption cross section, e.g. using the relation:

$$M_e = \frac{AA \cdot M}{ACS_{subj}}.$$

It shall be clear that these expressions may be combined to calculate the calibration factor without requiring an explicit intermediate calculation of the antenna aperture.

The method further comprises measuring 107 a received power on the radiofrequency antenna of the exposimeter, and determining 108 the whole-body averaged specific absorption ratio of absorbed radio-frequency electromagnetic radiation in said person by applying said calibration factor. The received power may be a perceived power of diffuse radiofrequency electromagnetic radiation. The received power may be measured under uncontrolled conditions, e.g. in an uncontrolled environment. Thus, the received power may be measured under arbitrary exposure conditions. Particularly, the measured received power may be received by the radiofrequency antenna of the exposimeter when the person is outside the chamber (e.g. when the person is not present in the chamber), e.g. unlike the reference received power which is determined, for calibration purposes, with the person present in the chamber as a reference. Thus, after calibration, a measurement of the received power may be related to the whole-body averaged SAR regardless of the environment in which the person is exposed. For example, the measured received power may not correspond to a power of electromagnetic radiation emitted by the radiofrequency emitter in the chamber. Thus, in accordance with embodiments of the present invention, measuring the received power on the radiofrequency antenna of the exposimeter may comprise measuring the received power in an uncontrolled environment outside the chamber.

However, embodiments of the present invention need not be limited to measuring this received power outside the chamber used for calibration, e.g. in accordance with some embodiments of the present invention, measuring the received power on the radiofrequency antenna of the exposimeter may also comprise measuring the received power in an uncontrolled environment inside the chamber. For example, the calibration may involve emitting a controlled radiofrequency signal in the room, while the received power may correspond to a received power from an uncontrolled and/or unknown radiofrequency source in the room.

In embodiments according to the present invention, determining the whole-body averaged specific absorption ratio of absorbed radio-frequency electromagnetic radiation in the person may comprise dividing the received power by the calibration factor. The calibration factor $M_e$ may for example express a ratio of the received power $P_r'$ on the radiofrequency antenna of the exposimeter and the whole-body averaged specific absorption ratio $SAR_{wb}$ of absorbed radio-frequency electromagnetic radiation in the person. However, it shall be clear that the calibration may be equivalently formulated in other ways, in accordance with embodiments of the present invention, e.g. the inverse of this ratio, a predetermined product of a predetermined factor and this ratio or its inverse, a logarithm of this ratio or its inverse, or any other known way of expressing a proportionality relation. The calibration factor may for example be interpreted as expressing an electromagnetic mass $M_e$ of the person. For example, $SAR_{wb}$ may be calculated by:

$$SAR_{wb} = \frac{ACS_{subj} \cdot S'_{inc}}{M} = \frac{ACS_{subj} \cdot P'_r}{M \cdot AA} = \frac{P'_r}{M_e},$$

where $S'_{inc}$ refers to the incident power density corresponding to the received power $P_r'$, e.g. under uncontrolled conditions to be assessed.

A method according to embodiments may also comprise storing the determined whole-body averaged specific absorption ratio in a memory, e.g. a memory integrated in the exposimeter.

A method according to embodiments may also comprise displaying the determined whole-body averaged specific absorption ratio on a display integrated in the exposimeter.

A method according to embodiments may also comprise transmitting the determined whole-body averaged specific absorption ratio to an external data processing and/or data storage unit, e.g. an exposure monitoring, auditing and/or alert system.

It shall be clear that the order in which these steps are performed may vary, in so far the required information and/or conditions used in each step are satisfied. For example, in embodiments according to the present invention, the reverberation time of the chamber with the person absent may be determined, then the absorption cross section of the chamber with the person absent may be determined, then the reverberation time of the chamber with the person present may be determined, then the absorption cross section of the chamber with the person present may be determined, then the absorption cross section of the person may be determined, then the antenna aperture may be determined, then the calibration factor may be determined, which may then be used to determine the $SAR_{wb}$ of the person under exposure conditions to be assessed. However, for example, the order of measurements performed in the chamber having the person present and measurements performed in the chamber from which the person is absent could be reversed. Also, measurements for calibration may be performed before the calculation of the calibration factor and intermediate quantities, or intermediate quantities may be calculated whenever the required measurements become available.

It shall also be clear to the person skilled in the art that the measurements obtained in the chamber with the person absent, and/or quantities calculated using only such subject-independent information, may be stored for later use, e.g. to efficiently calculate a person-specific calibration factor for a plurality of persons using the same chamber and the same emitter and receiver setup in this chamber.

Figure 5:
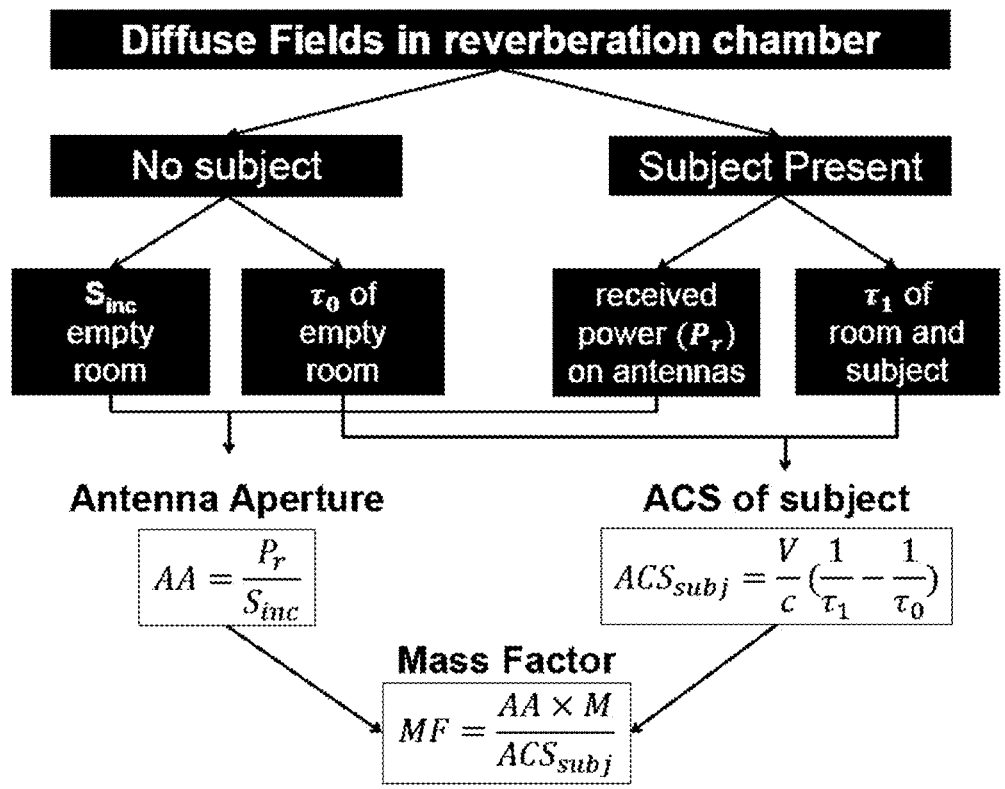
FIG. 5 illustrates measurements and calculations performed in an exemplary method in accordance with embodiments of the present invention.

Referring to FIG. 5, various measurements and calculations in an exemplary method in accordance with embodiments of the present invention are illustrated, in which 'Mass Factor' (MF) refers to the calibration factor indicative of an electromagnetic mass of the subject.

In a second aspect, the present invention relates to a system for determining a whole-body averaged specific absorption ratio of absorbed radio-frequency electromagnetic radiation in a person. Various features of such system according to embodiments of the present invention shall be clear from the description provided hereinabove relating to a method according to embodiments of the present invention. For example, a processor in a system according to embodiments of the present invention may be programmed for performing method steps of a method in accordance with embodiments of the present invention, as detailed hereinabove.

Figure 2:
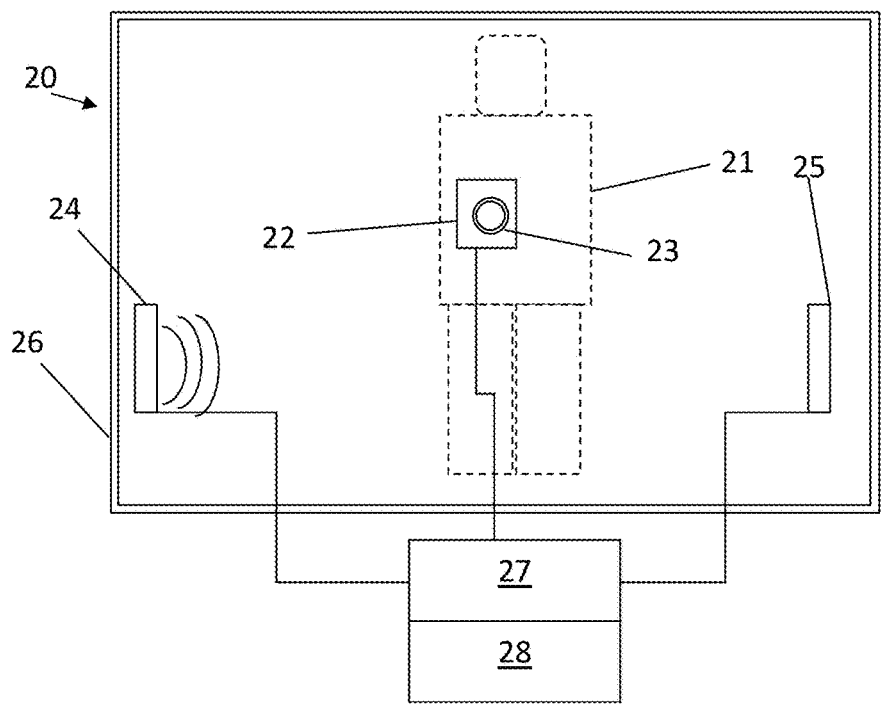
FIG. 2 illustrates a system according to embodiments of the present invention.

FIG. 2 schematically shows a system 20 for determining a whole-body averaged specific absorption ratio of absorbed radio-frequency electromagnetic radiation in a person 21.

The system comprises an exposimeter 22, which comprises at least one radiofrequency antenna 23, for positioning on the body of the person 21, e.g. for attaching to the body of the person 21, e.g. integrated in clothing or wearable apparel. For example, the exposimeter may be a wearable or portable device. The exposimeter may thus be integrated in a piece of clothing, in a collar or in a wristband. The exposimeter may comprise a clip suitable for attaching the exposimeter to a piece of clothing. The exposimeter may be a handheld device, e.g. may have dimensions and a weight suitable for carrying in one's hand. While a suitcase could be considered handheld, 'handheld' in the present context refers to a device having dimensions and weight similar to, for example, a mobile phone or hand tool. For example, the volume of the exposimeter may be confined in a box having dimensions equal to or less than 20 cm×15 cm×5 cm, preferable equal to or less than 10 cm×10 cm×5 cm, or, even more preferred, equal or less than 5 cm×5 cm×3 cm, or even more preferred, less than 5 cm×5 cm×1 cm. The weight of the exposimeter may be equal to or less than 1 kg, preferably equal to or less than 500 g, and even more preferred, equal to or less than 200 g, such as having a mass in the range of 0 g to 100 g, or 0 g to 50 g.

The exposimeter may comprise a plurality of radiofrequency antennas, as explained hereinabove in relation to embodiments of the first aspect of the present invention.

For example, the exposimeter may comprise a textile antenna, or another type of antenna suitable for integration in a wearable or portable, e.g. handheld, device.

Figure 4:
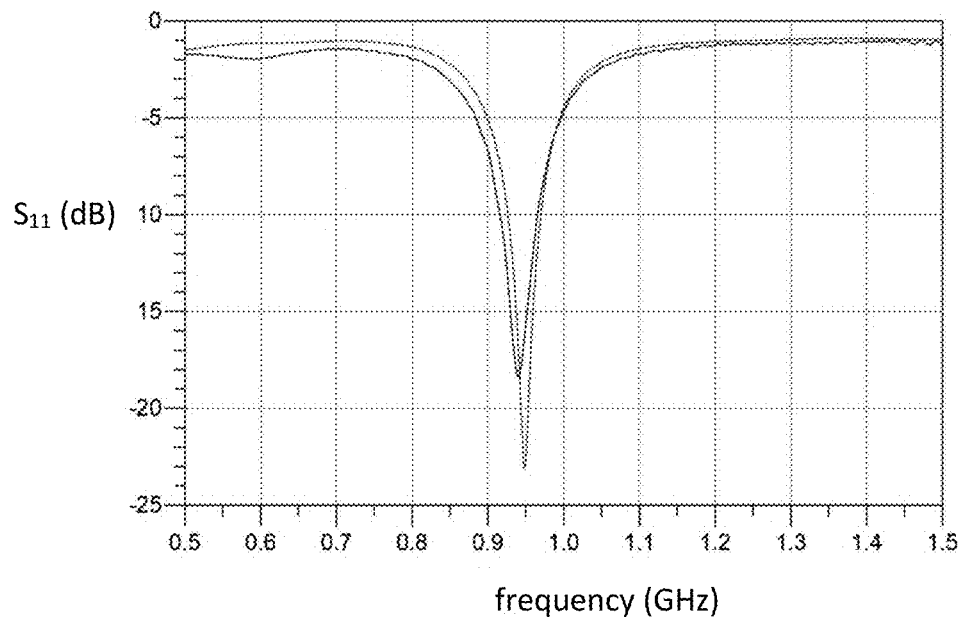
FIG. 4 shows an exemplary power reflection coefficient as function of frequency of an antenna in accordance with embodiments of the present invention.

For example, the exposimeter may comprise a textile antenna, e.g. a textile-compatible antenna. Such antenna may for example have an area of 135 mm×115 mm. Such antenna may be adapted for providing a good response, e.g. to a global system for mobile communications (GSM) downlink (DL) band, e.g. in the range of 925 MHz to 960 MHz. An exemplary power reflection coefficient as function of frequency is shown in FIG. 4 for such antenna. It is an advantage that this power reflection coefficient is below −10 dB in the frequency band in which measurements take place, e.g. thus having a good performance in the intended range. However, embodiments of the present invention are not necessarily limited to antennas having such characteristics, e.g. measurements may be performed with a less performant antenna.

The antenna may be textile compatible. Such antenna may be combined with wearable receiver electronics. It is an advantage of textile antennas that can be are very lightweight, and do not substantially interfere with body movement. Such textile antenna may, for example, be worn on the upper torso.

The system further comprises at least one radiofrequency emitter 24 and at least one radiofrequency receiver 25 for installing in a chamber 26 forming an electromagnetic cavity.

A system according to embodiments of the present invention may furthermore comprise the chamber having the radiofrequency emitter and the radiofrequency receiver installed therein.

In a system according to embodiments, both the radiofrequency emitter and the radiofrequency receiver may be arranged in the far-field of the location where the person will be present in the chamber.

In the chamber, the radiofrequency receiver may be arranged in the far field of radiofrequency electromagnetic radiation emission of the emitter.

The system also comprises a processor 27 configured for receiving an electromagnetic power as function of time and/or frequency from the radiofrequency receiver 25 when the receiver is installed in the chamber 26, and for obtaining a reference received power from the radiofrequency antenna 23 of the exposimeter 22. The processor may for example be connected to the receiver and/or exposimeter via a data transmission wire, or via a wireless communication module. The processor may further be wired or wirelessly connected to the emitter 24. The processor may be configured for controlling a radiofrequency electromagnetic emission of the emitter.

The processor may be integrated in the emitter, in the receiver or the exposimeter, or may be a separate unit. For example, the processor may comprise a computer or smartphone, or may comprise an application-specific integrated circuit.

The system further comprises a memory 28, e.g. operably connected to the processor or integrated in the processor.

The processor and the memory may comprise a plurality of processing and/or memory units, e.g. a processor and/or memory integrated in the exposimeter and a processor and/or memory in an external unit that is not integrated in the exposimeter. For example, the external unit may be integrated in the receiver or transmitter. As detailed hereinabove in relation to the first aspect of the present invention, the receiver and transmitter may also be integrated in a single device, e.g. comprising a receiver/emitter antenna and switching electronics.

For example, the exposimeter may comprise receiver electronics, e.g. wearable receiver electronics, for measuring, processing and/or storing a received electromagnetic power detected by the at least one antenna. Such receiver electronics may be adapted for communicating with the processor, or may comprise the processor or a part thereof capable of performing data processing.

The processor may thus comprise at least one processing unit integrated in the exposimeter.

The processor 27 is programmed for determining a first reverberation time representative of a first decay of electromagnetic power in the chamber when the person is absent from the chamber, and for determining a free-space incident power density in the chamber when the person is absent from the chamber. This electromagnetic power is detected by the radiofrequency receiver in response to a radiofrequency emission by the radiofrequency emitter when the person is absent from the chamber.

The processor is further programmed for determining a second reverberation time representative of a second decay of electromagnetic power in the chamber when the person is present in the chamber, and for simultaneously determining the reference received power received by the radiofrequency antenna of the exposimeter when the person is present in the chamber. This electromagnetic power is detected by the radiofrequency receiver in response to a radiofrequency emission by the radiofrequency emitter when the person is present in the chamber.

The processor may be programmed for determining the first reverberation time and/or the second reverberation time as an inverse of a slope of a logarithm of the electromagnetic power detected by the radiofrequency receiver with respect to time, in which this inverse is multiplied by a constant factor, as described in detail hereinabove.

The processor is further programmed for determining an absorption cross section of the person taking the first reverberation time, the second reverberation time and a predetermined volume of the chamber into account.

The processor may be programmed for determining the absorption cross section of the person as the difference of the inverse of the second reverberation time and the inverse of the first reverberation time, wherein the difference is multiplied by the predetermined volume and divided by a speed of propagation of electromagnetic radiation in the chamber, e.g. as described in detail hereinabove.

The processor is further programmed for determining a calibration factor, e.g. representative of an electromagnetic mass of the person, and storing this calibration factor in the memory. The calibration factor expresses a ratio of a received power on the radiofrequency antenna of the exposimeter and the whole-body averaged specific absorption ratio of absorbed radio-frequency electromagnetic radiation in the person. Determining this calibration factor, by the processor, takes the reference received power, the incident power density, the absorption cross section and a predetermined mass of the person into account.

The processor may be programmed for determining an antenna aperture as a ratio of the reference received power over the incident power density, e.g. as described hereinabove in relation to embodiments of the first aspect of the present invention.

The processor may be programmed for determining the calibration factor as a ratio of a product of the antenna aperture and said predetermined mass over the absorption cross section, e.g. as described hereinabove in relation to embodiments of the first aspect of the present invention.

The processor is also programmed for measuring a received power on the radiofrequency antenna of the exposimeter, e.g. for receiving a measurement of received power on the radiofrequency antenna of the exposimeter from the exposimeter, e.g. via a wired or wireless transmission of a signal, and determining the whole-body averaged specific absorption ratio of absorbed radio-frequency electromagnetic radiation in the person by applying this calibration factor.

The processor may be programmed for determining the whole-body averaged specific absorption ratio of absorbed radio-frequency electromagnetic radiation in the person by dividing the received power by the calibration factor, e.g. as described in detail hereinabove.

The system according to embodiments of the present invention may also comprise an input device, e.g. a touchpad, a touchscreen, a keyboard, a voice recognition unit, a computer mouse, a control stick, an optical scanner, an RFID tag reader, a data communication module and/or other input device known in the art, for receiving the predetermined mass and the predetermined volume as input and storing the input in the memory. Furthermore, the processor may be adapted for receiving the state of the person as either absent or present in the chamber. The processor may be adapted for prompting the person for entering and/or exiting the chamber before and/or after performing operations as described hereinabove. For example, the system may comprise a display or sound emitter for prompting the user.

For example, a system according to embodiments may comprise a plurality of on-body wearable nodes, e.g. two on-body wearable nodes, which may each comprise at least one broadband antenna. The system may also comprise two off-body antennas that can be used for calibration. The on-body wearable nodes, e.g. the exposimeter(s), may comprise electronics for registering the received power on the antenna(s).

The off-body antennas can be used to determine the calibration factor, e.g. representative of an electromagnetic mass $M_{e,subj}$ of the subject who will be wearing the antennas. Measurements of the reverberation time ($\tau$) in a closed environment, e.g. a closed room, may be performed, in which $\tau$ is a time constant of the decay of EM power in the closed environment. This decay may be caused by the loss in the room, which may include the absorbed power in the body of the subject wearing the exposimeter, when present in the closed environment. In a first step of the calibration, as described hereinabove, the off-body antennas may be present in the environment, while the person is not present. In a second step, the subject may be present in the environment. The calibration factor $M_{e,subj}$ may then be determined. This calibration may be transmitted to the exposimeter as calibration information. Such procedure may be designed as a plug-and-play method for exposimeter use, and may be performed, for example, only once, for calibrating the exposimeter to a specific person, or multiple times, e.g. before each use of the exposimeter to measure an RF field exposure. The calibration may also be repeated to improve the quality of the calibration factor by applying an averaging or other statistical summary method for increased robustness.

After calibration, the subject may, for example, perform activities while wearing the on-body antennas and the $SAR_{wb}$ can then be determined from measurements of received power on the antennas.

In an example for illustrating aspects of the present invention, not intended to limit the invention in any way, a test is performed with an exposimeter comprising a single on-body antenna. The on-body antenna in this example is a textile antenna, having dimensions of about 135 mm×115 mm. The antenna is used for determining $SAR_{wb}$ in the GSM 900 DL band (925-960 MHz). The exposimeter is worn on the upper torso.

Figure 6:
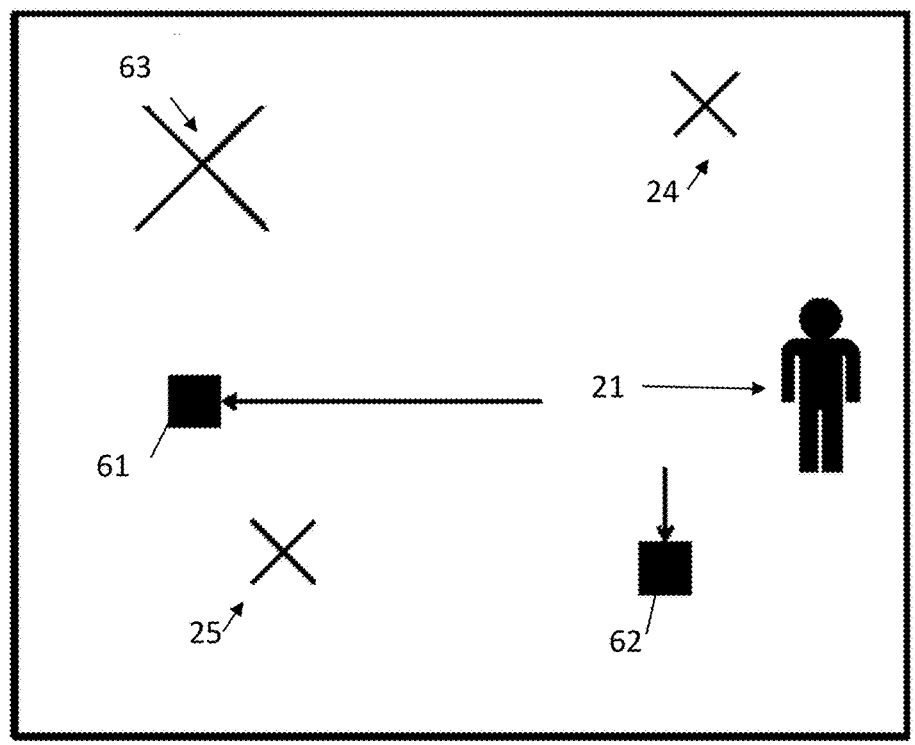
FIG. 6 schematically shows an experimental setup in a reverberation chamber, in an example illustrating embodiments of the present invention.

FIG. 6 shows a setup in a reverberation chamber, in which an emitter 24 and a receiver 25 are positioned. Furthermore, a stirrer 63 is provided for improving EM diffuse modes in the chamber. The method for calibration in accordance with embodiments was performed separately for the person 21, when present in the room, at two different positions 61 and 62 in the chamber.

In accordance with the mathematical expression provided hereinabove, following values are obtained:

|  | Position 61 | Position 62 |
|---|---|---|
| $ACS_{subj}$ (m$^2$) | 0.32 0.29, 0.35] | 0.34 [0.31, 0.37] |
| AA (cm$^2$) | 3.3 [1.1, 10] | 2.8 [1.2, 6.3] |
| $M_{e, subj}$ (kg) | 0.084 [0.028, 0.25] | 0.071 [0.031, 0.16] |

These reported values correspond to the logarithmic mean and 68% prediction intervals ($PI_{68}$). Even though corresponding antenna apertures are obtained for both positions, relatively large prediction intervals are observed, e.g. 9.6 dB and 7.2 dB.

However, by using multiple antennas on the body, advantageously a more robust estimate can be obtained by averaging. For example, the variance of an average over multiple antennas can be expressed as:

$$VAR\left[\frac{1}{N}\sum_{i=1}^{N} AA_i\right] = \frac{1}{N^2}\sum_{i=1}^{N} Var[AA_i] + \frac{1}{N^2}\sum_{i=1}^{N}\sum_{j=1}^{N} Cov[AA_i, AA_j](1 - \delta_{ij})$$

Where Var represents variance, Cov represents covariance, N represents the number of antennas, $AA_i$ represents an antenna aperture determined for antenna i, and $\delta_{ij}$ represents Kronecker's delta.

Figure 7:
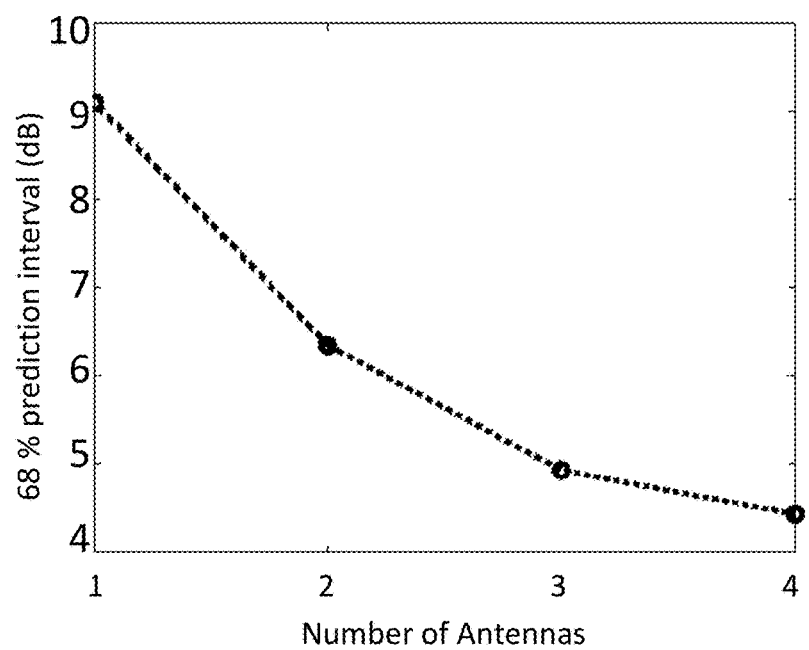
FIG. 7 shows a decrease of prediction interval of antenna aperture for an increasing number of antennas, in an example illustrating embodiments of the present invention.

FIG. 7 shows a median decrease of $PI_{68}$ for an increasing number of antennas, where median values for the prediction intervals were obtained for 32 experimental repetitions. It can also be observed that the relative improvement in $PI_{68}$ decreases for increasing number of antennas; This is illustrated in the following table, where N indicates a number of antennas:

|  | $PI_{68}(N + 1) - PI_{68}(N)$ |
|---|---|
| N = 1 → N = 2 | 2.8 dB |
| N = 2 → N = 3 | 1.4 dB |
| N = 3 → N = 4 | 0.5 dB |

Therefore, a relatively small number of antennas in the exposimeter may be sufficient to obtain good estimates of AA, and hence of $SAR_{wb}$. This may, for example, be explained by the observed small correlation values ρ between 0.03 and 0.09 and consequently small covariance (Cov) values between antenna apertures of antennas worn on the front and back of the body in diffuse fields, in agreement with room electromagnetics theory of diffuse fields.

In a further example for illustrating aspects of the present invention, not intended to limit the invention in any way, tests are performed with 11 textile-compatible, body-worn antennas. Wireless telecommunication signals can occur in different frequency bands. The antennas used in these tests are tuned to the frequency bands listed in following table:

| Service | Frequency range (MHz) |
|---|---|
| FM Radio | 87.5-108 |
| TV3 | — |
| TETRA I | — |
| TETRA II | — |
| TETRA III | — |
| DVB-T | 470-790 |
| DL-800 | 791-821 |
| UL-800 | 832-862 |
| UL-900 | 880-915 |
| DL-900 | 925-960 |
| UL-1800 | 1710-1785 |
| DL-1800 | 1805-1880 |
| DECT | 1880-1900 |
| UL-1900 | 1920-1980 |
| DL-1900 | 2110-2170 |
| Wifi-2G | 2400-2485 |
| UL-2600 | 2500-2570 |
| DL-2600 | 2620-2690 |
| WiMax 3.5 | 3400-3600 |
| Wifi-5G | 5150-5875 |

In the table hereinabove, 'UL' refers to uplink, e.g. radiation originating from a mobile phone handset, while 'DL' refers to downlink, e.g. radiation originating from a mobile phone base station.

The RF nodes used in this example comprise linearly (WiFi 5 GHz) and elliptically (for the other bands) polarized substrate-integrated-waveguide (SIW) textile antennas. At lower frequency bands, standard FR4 printed-circuit board (PCB) material is used, whereas for the WiFi 5 GHz band a high-frequency substrate, obtainable from the Rogers company, is employed. The antennas are fabricated with textile materials, and a logarithmic RF power detection unit tuned to the desired frequency band, e.g. as listed in the table hereinabove. An RF power detection unit records the received power ($P_r$) on the textile antenna and provides a geometric averaged received power with a resolution of 1 dB and a sample interval of 1 Hz. All the RF nodes are powered by a 5 V (13000 mAh) battery. The RF node is lightweight, does not substantially interfere with body movement and is suitable for real-life application measurements. Each encapsulated antenna has a surface of 9×11 cm$^2$, except for the LTE 800, GSM 900 UL and DL bands, for which antennas having a surface of 9×11 cm$^2$ are used. All the nodes are connected to a common bus system, allowing convenient readout of the data from different nodes.

The antennas are worn on the body in order to perform instantaneous measurements of the incident EMFs. It has been observed that wearing multiple antennas on the body will result in measurements of the incident power density and $SAR_{wb}$ with a smaller uncertainty. However, there is only limited space available on the body. Therefore, two antennas for each frequency band are used, placed on diametrically opposite locations on the body. This approach is a compromise between the advantages of using multiple antennas in the same frequency bands, in this case two, and using a limited amount of space on the body for each frequency band, in order to cover as many bands as possible.

Figure 8:
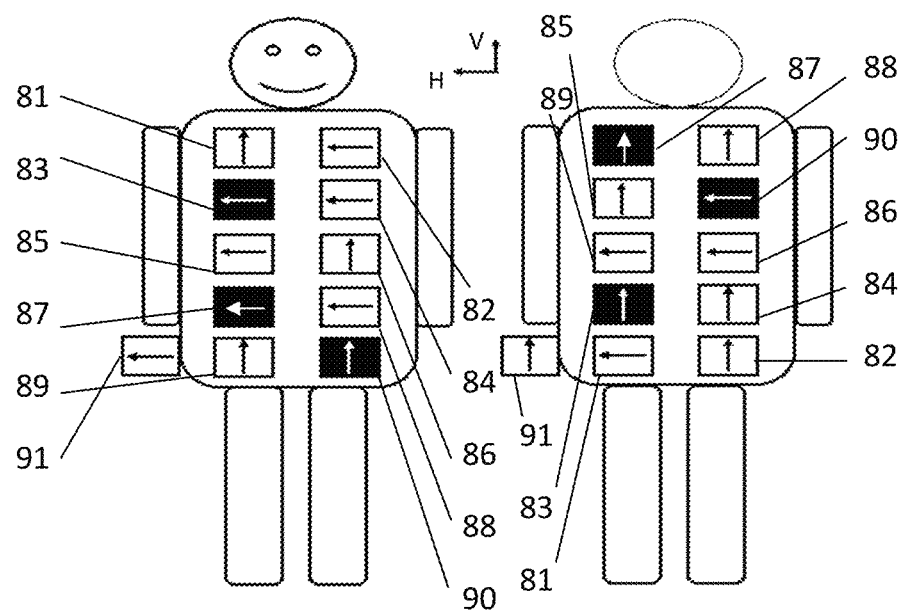
FIG. 8 shows an exemplary orientation and placement of antennas on locations on the body for multiple frequency bands, in an example relating to embodiments of the present invention.

While textile antennas in accordance with embodiments of the present invention may be stuck onto the body, in this example, the antennas are placed in a jacket. This may advantageously improve the comfort of the user when compared to antennas stuck to the body, and also allows to visibly cover the antennas, which is beneficial for the measurements. FIG. 8 shows an illustration of available locations on the body, and an optimized combination and orientation for each antenna that is placed on a corresponding location, forming 22 nodes in total, 2 nodes per frequency band. The indicated locations are location 81 corresponding to antennas for GSM 1800 UL, location 82 for LTE 2600, location 83 for LTE 800, location 84 for GSM 1800 DL, location 85 for WiFi 5 GHz, location 86 for UMS UL, location 87 for GSM 900 DL, location 88 for DECT, location 89 for GSM 900 UL, location 90 for WiFi 2 GHz and location 91 for UMS DL.

Figure 9:
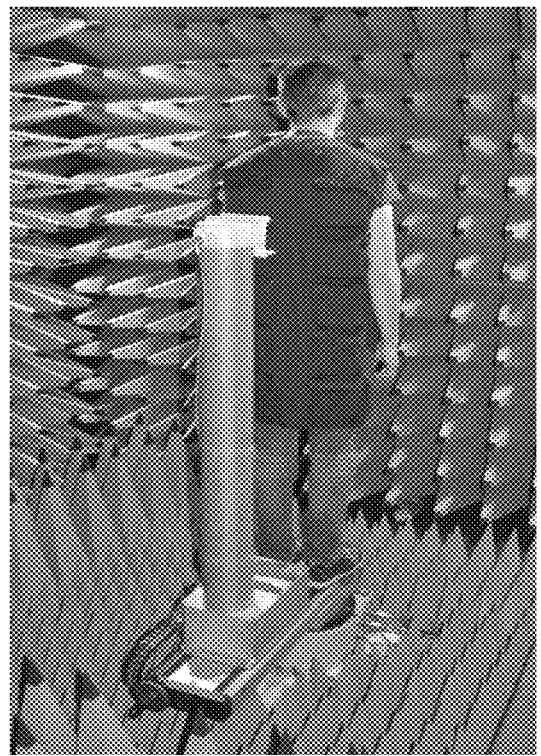
FIG. 9 shows a picture of a human subject wearing a jacket comprising integrated antennas of a $SAR_{wb}$ meter, in an example relating to embodiments of the present invention.

FIG. 9 shows a picture of the integrated antennas, of a $SAR_{wb}$ meter in accordance with embodiments of the present invention, placed inside a jacket which is worn by a male subject, e.g. who can carry our $SAR_{wb}$ measurements in a real life application.

The absorption of RF EMFs is studied using the absorption cross-section (ACS, unit: m²) in indoor environments. This quantity is defined as:

$$ACS = \frac{P_{abs}}{S_{inc}}$$

with $P_{abs}$ the absorbed power in a room (unit: W) and $S_{inc}$ the incident power density (unit: W/m²) in the diffuse field. This absorption cross section can be obtained from the reverberation time ($\tau$) in a room with volume (V), in accordance with the formula:

$$\tau = \frac{4V}{ACS \times c}$$

where c refers to the speed of light.

Figure 10:
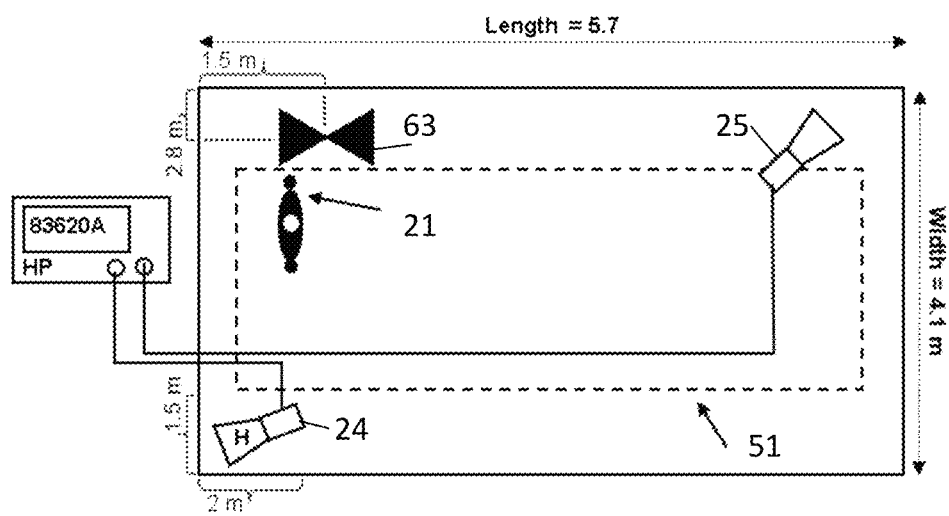
FIG. 10 shows an exemplary setup in a reverberation chamber used for an example illustrating embodiments of the present invention.

FIG. 10 shows an illustration of the set-up used for this example in a reverberation chamber. The reverberation chamber is a cuboid with a metallic coating of volume V=5.7×4.1×2.8 m³=65 m³. The room contains an electromagnetic stirrer 63 that can be rotated around its axis and perturbs the EMFs in the reverberation chamber. If the fields in the chamber are averaged over a full rotation of the stirrer, they can be regarded as being perfectly diffuse. The room contains one radiofrequency emitter 24, e.g. a transmitting antenna (TX), for which a SAS-571 horn antenna is used in this example, placed on a tripod of 1.5 m height in a corner of the room. The signals are received by a radiofrequency receiver 25, for which in this example an identical receiving antenna (RX) on a tripod of 1.5 m height is used, which is placed in the opposite corner. The subject 21, a 28 year old male subject with a BMI of 23.6 kg/m² and a mass of 79 kg, is placed in a working area 51 of the chamber in the room.

First, an isotropic field probe (NARDA NBM 550, Narda, Hauppage, N.Y., USA) is used to measure the $S_{inc}$ from 0.53 m to 2.03 m above the floor; along a vertical line on each of the two studied positions. During these measurements the TX emits a continuous wave at the center frequency of the bands listed in the table hereinabove with an input power of 1 mW, while the stirrer rotates 360° at a speed of 6°/s. This $S_{inc}$ is then averaged over the height of the subject (1.83 m) and all orientations of the stirrer, in order to determine the $S_{inc}$ in diffuse fields.

Second, the reverberation time $\tau_0$ is measured in an 'empty' room, i.e. in the absence of the subject 21, in order to obtain the $ACS_0$ of the 'empty' room as a function of frequency.

In a third step, the human subject 21 is placed in the room and a second reverberation time $\tau_1$ and corresponding $ACS_1$ are obtained. The $ACS_{subj}$ of the subject is then obtained as the difference between the two reverberation times:

$$ACS_{subj} = ACS_1 - ACS_0 = \frac{4V}{c}\left(\frac{1}{\tau_1} - \frac{1}{\tau_0}\right)$$

This $ACS_{subj}$ can then be used to determine the $SAR_{wb}$:

$$SAR_{wb} = \frac{ACS_{subj} \times S_{inc}}{M}$$

in which M refers to the mass of the subject. For these measurements a pulse of 2 µs with a bandwidth of 5023 MHz around 3337 MHz is used.

In a fourth step of the tests performed in this example, the subject, who is wearing the $SAR_{wb}$ meter, enters the reverberation chamber. The TX emits subsequently at the center frequencies of the bands listed in the table hereinabove at an input power of 1 mW, and the stirrer is rotated at a speed of 2°/s from 0° to 360°, emulating a diffuse field at each of the different center frequencies. During this rotation, the received power on the antenna ($P_r$ ($\phi$)) is recorded as a function of the rotation angle $\phi$ of the stirrer. These are then averaged over $\phi$, in order to obtain $P_r$, the received power on the antenna in diffuse fields. The antenna aperture (AA) in diffuse fields is then equal to:

$$AA = \frac{P_r}{S_{inc}}$$

This AA can then be used to determine the $SAR_{wb}$ from measurements with the $SAR_{wb}$ meter in accordance with embodiments, e.g. using the RF nodes, in diffuse fields:

$$SAR_{wb} = \frac{ACS_{subj} \times S_{inc}}{M} = \frac{ACS_{subj} \times P_r}{M \times AA} = \frac{P_r}{MF}$$

with MF the mass factor (unit: kg). This factor can be used to obtain the $SAR_{wb}$ from the power received on an antenna. The AA and the $ACS_{subj}$ are independent of the subject's position and orientation in the reverberation chamber but are dependent on the frequency.

Figure 11:
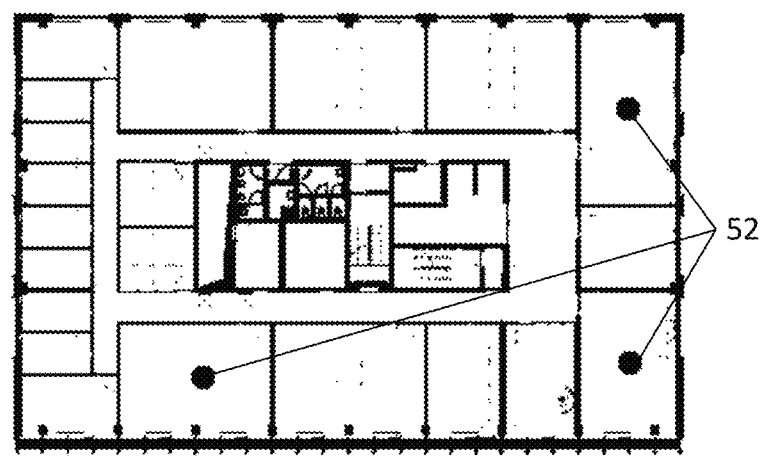
FIG. 11 shows a floor plan of an office building used for indoor measurements in an example illustrating embodiments of the present invention.

To demonstrate a practical application of the $SAR_{wb}$-meter and to validate it in a realistic environment, measurements were executed in an office environment. The subject wearing the $SAR_{wb}$ meter performed a pre-defined walk in an indoor environment, on the 5th floor of an office building in Ghent University (Belgium). FIG. 11 shows the ground plan of the office building used for indoor measurements. Three office rooms were selected and the subject walked randomly in an area of 1 m² in the center of each room for 15 minutes. It is to be noted that the $SAR_{wb}$ meter can simultaneously measure $S_{inc}$ and determine $SAR_{wb}$. The measured power densities in each office room were averaged over the subject's movements during the 15-minute measurement resulting in one single power density value independent of time. The WiFi 2 GHz was considered for validation as this is an indoor source that emit strong diffuse signals in the building.

In order to validate measurements obtained by the $SAR_{wb}$ meter in accordance with embodiments of the present invention, the incident power densities are measured using a tri-axial antenna and a spectrum analyzer (R&S FSL, Rhode & Schwartz, Munich, Germany). The antenna is placed 1.5 m above the ground on each of the 3 locations 52 and measures the incident power density.

Figure 12:
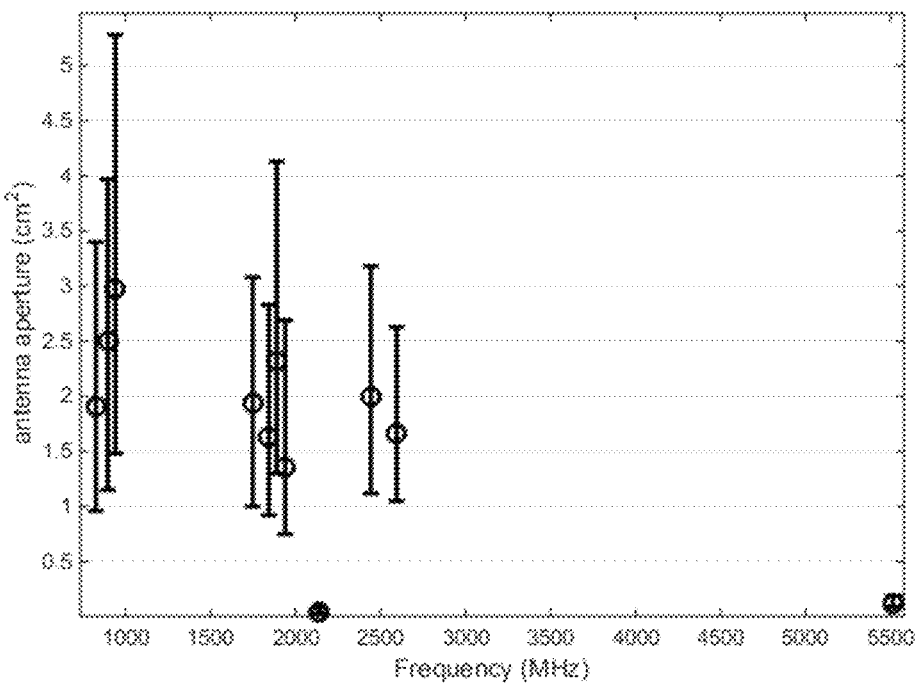
FIG. 12 shows on-body antenna apertures (AA) obtained by calibration measurements in a reverberation room, in an example illustrating embodiments of the present invention.

FIG. 12 illustrates the on-body antenna aperture obtained from calibration measurements in the reverberation room. Circles indicate the median antenna aperture AA for frequency bands listed in Table 1 (center frequency). The error bars indicate 16% and 84% percentiles of the antenna aperture's distribution for the best combination of single nodes (front and back). The median antenna apertures range from 0.046 cm2 (for UMTS-UL) to 2.97 cm2 (for GSM 900 DL). The antenna apertures depend on the directive gain of the used antenna, the antenna efficiency and the square of the wavelength of the received signals.

FIG. 12 shows the determined on-body antenna aperture as function of frequency according to the best combination of single nodes (front and back). Error bars indicate 16% and 84% percentiles of AA values. The smaller antenna apertures at 2140 and 5513 MHz are due to the electrical distance that affects the antenna performance in presence of human body.

Figure 13:
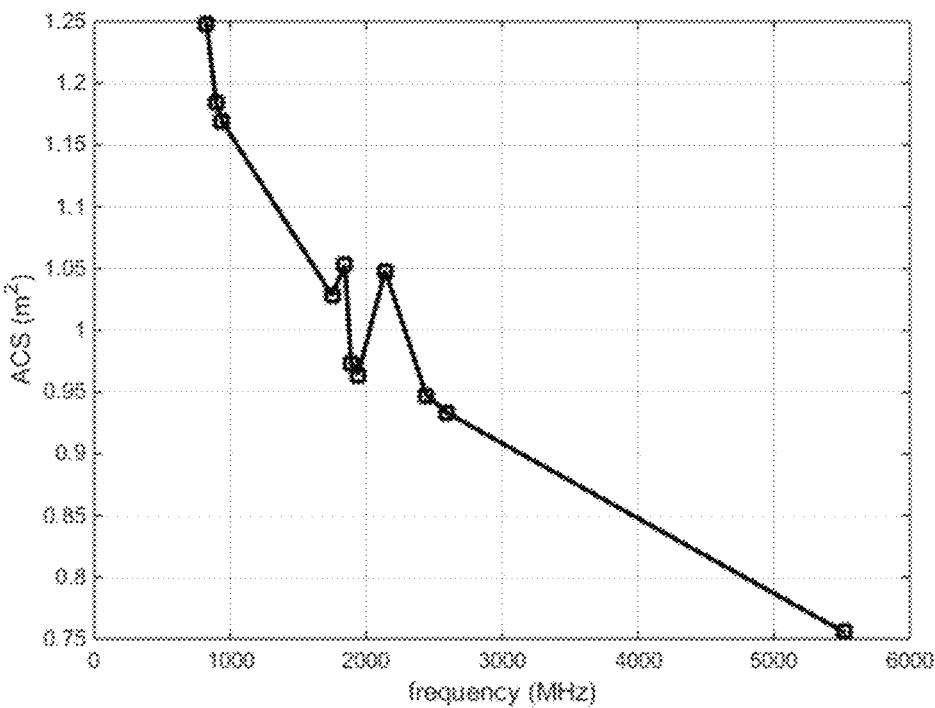
FIG. 13 shows absorption cross sections, as a function of frequency, of a human subject standing in a reverberation chamber, in an example illustrating embodiments of the present invention.

FIG. 13 shows the absorption cross section of the male subject standing in the reverberation chamber as a function of frequency, obtained from measurements in the reverberation chamber.

The ACS varies in the range of 0.75 m² to 1.25 m² and decreases with increasing the frequency. This ACS depends on body shape of the subject, the square of the wavelength and the penetration depth (absorption) of the waves into the body. The mass factor (MF) is obtained by dividing ACS values to mass of the subject. The table hereinbelow summarizes the MF for the male subject. This MF decreases for increasing frequencies due to the decrease in ACS with increasing frequency.

| RF signal | LTE 800-DL | GSM 900-UL | GSM 900-DL | GSM 1800-UL | GSM 1800-DL | DECT |
|---|---|---|---|---|---|---|
| Center frequency [MHz] | 806 | 896 | 941 | 1748 | 1843 | 1890 |
| MF [kg] | 85.6 | 81.2 | 80.2 | 70.5 | 72.2 | 66.7 |
| PI$_{50}$ (SARwb) [dB] | 2.5 | 2 | 1.5 | 1 | 1 | 0.5 |
| PI$_{50}$ MF [kg] | 3.6 | 3.5 | 4 | 3.5 | 3.1 | 3.5 |

| RF signal | UMTS-UL | UMTS-DL | WiFi-2 GHz | LTE 2600-DL | WiFi 5 GHz |
|---|---|---|---|---|---|
| Center frequency [MHz] | 1940 | 2140 | 2443 | 2655 | 5513 |
| MF [kg] | 66.1 | 71.9 | 65.02 | 64.04 | 51.8 |
| PI$_{50}$ (SARwb) [dB] | 11.5 | 1 | 3.5 | 1 | 0.5 |
| PI$_{50}$ (MF) [kg] | 3.5 | 3 | 2.5 | 3 | 2.1 |

The AA is not constant, as shown in FIG. 12, and has a certain distribution. The spread of this distribution and the measurement uncertainty on the $S_{inc}$ associated with this spread can be quantified using a prediction interval (PI). Consequently, the MF has a distribution which can be characterized using a prediction interval as well. The 50% prediction intervals (PI$_{50}$) in each frequency band have been used as proxies for the measurement uncertainty on the $SAR_{wb}$ measured using the $SAR_{wb}$-meter. The table hereinabove lists the PI$_{50}$ on the MF in each of the considered frequency bands.

The SARwb meter has a relatively low measurement uncertainty in the range of 0.5 (DECT) to 3.5 dB (WiFi 2 GHz), except UMTS-UL that has a relatively larger uncertainty of about 11.5 dB.

The table hereinbelow lists the measured incident power densities $S_{inc}$ in the 3 validation measurement locations in the office building using the $SAR_{wb}$ meter and a tri-axial broadband antenna in combination with a spectrum analyser, in the WiFi 2 GHz band. The measured power densities using the $SAR_{wb}$ meter in each location are averaged over 15-minutes. The measured values using the $SAR_{wb}$ meter range from 1.2 to 4.45 µW/m². A good agreement between both measurements can be observed, which indicates that the measurement device in accordance with embodiments works properly.

| Location | SAR$_{wb}$ meter (dBW/m²) | Spectrum analyser (dBW/m²) |
|---|---|---|
| Room 1 | −55.66 | −51.44 |
| Room 2 | −55.88 | −54.16 |
| Room 3 | −56.11 | −52.5 |

The table hereinbelow lists measured $SAR_{wb}$ and incident power density for a walk in the corridor of the office building. The measured median $S_{inc}$ is in the range of 1.58 µW/m² (GSM 900 UL) to 243.4 µW/m² (UMTS-DL). The median SARwb is in the range of 0.011 µW/kg (UMTS-UL) to 3.35 µW/kg (UMTS-DL).

| RF signal | LTE 800-DL | GSM 900-UL | GSM 900-DL | GSM 800-UL | GSM 800-DL | DECT |
|---|---|---|---|---|---|---|
| Center frequency [MHz] | 826 | 896 | 941 | 1748 | 1843 | 1890 |
| P$_{50}$ (S$_{inc}$) [µW/m²] | 11.67 | 1.58 | 26.7 | 2.89 | 2.72 | 1.92 |
| P$_{50}$ (SAR$_{wb}$) [µW/kg] | 0.19 | 0.024 | 0.41 | 0.039 | 0.037 | 0.024 |

-continued

| RF signal | UMTS-UL | UMTS-DL | WiFi-2 GHz | LTE 2600-DL | WiFi 5 GHz |
|---|---|---|---|---|---|
| Center frequency [MHz] | 1940 | 2140 | 2443 | 2595 | 5513 |
| $P_{50}(S_{inc})$ [µW/m²] | 93.2 | 243.4 | 2.49 | 2.68 | 88.2 |
| $P_{50}(SAR_{wb})$ [µW/kg] | 0.011 | 3.35 | 0.031 | 0.032 | 0.87 |

Thus, these examples have shown that a $SAR_{wb}$-meter in accordance with embodiments of the present invention can be used for obtaining $SAR_{wb}$ measurements in multiple frequency bands. The $SAR_{wb}$-meter may comprise a body area network, comprising multiple antennas, e.g. 22 nodes, for measuring the incident power density in multiple frequency bands, e.g. in 11 telecommunication bands. The $SAR_{wb}$-meter was calibrated in a reverberation chamber to determine a mass factor for the subject, in order to determine a real-life whole-body averaged specific absorption rate from the measured incident power density. The $SAR_{wb}$-meter may have a relatively low measurement uncertainty caused by the human body: e.g. 50% prediction intervals ($PI_{50}$) of 0.5 dB to 3.5 dB were observed, except for UMTS-UL (11.5 dB). The $SAR_{wb}$-meter can be used for indoor measurements, e.g. in an office building, and the results obtained in this example were validated using a tri-axial broadband antenna and a spectrum analyzer. A difference of 1.2 to 4.45 µW/m² was observed between the incident power densities measured by the SARwb-meter and the tri-axial antenna.

The invention claimed is:

1. A method for determining a whole-body averaged specific absorption ratio of absorbed radio-frequency electromagnetic radiation in a person, the method comprising:

positioning an exposimeter comprising at least one radiofrequency antenna on a body of said person;

providing a chamber forming an electromagnetic cavity, said chamber comprising at least one radiofrequency emitter and at least one radiofrequency receiver;

determining a first reverberation time representative of a first decay of electromagnetic power and a free-space incident power density in said chamber when said person is absent from said chamber, said determination being performed by a processor receiving said electromagnetic power as function of time and/or frequency, said electromagnetic power being detected and transmitted as a first signal to the processor by said radiofrequency receiver in response to a first radiofrequency emission of said radiofrequency emitter when said person is absent from said chamber;

determining, using said processor, a second reverberation time representative of a second decay of said electromagnetic power in said chamber and simultaneously determining a reference received power received by said radiofrequency antenna of said exposimeter when said person is present in said chamber, said electromagnetic power being detected and transmitted as a second signal to the processor by said radiofrequency receiver in response to a second radiofrequency emission by said radiofrequency emitter when said person is present in said chamber;

determining, using said processor, an absorption cross section of said person taking the first reverberation time, the second reverberation time and a predetermined volume of said chamber into account;

determining, using said processor, a calibration factor and storing said calibration factor in a memory, said calibration factor relating a received power on said radiofrequency antenna of said exposimeter to the whole-body averaged specific absorption ratio of absorbed radio-frequency electromagnetic radiation in said person; and measuring a received power on said radiofrequency antenna of said exposimeter and determining the whole-body averaged specific absorption ratio of absorbed radio-frequency electromagnetic radiation in said person by applying said calibration factor;

wherein determining said calibration factor takes said reference received power, said incident power density, said absorption cross section and a predetermined mass of said person into account.

2. The method according to claim 1, wherein providing said chamber comprises arranging both the emitter and the receiver in the far-field of a volume that said person will occupy in said chamber when determining said second reverberation time and said reference received power.

3. The method according to claim 1, wherein determining said calibration factor comprises determining an on-body antenna aperture as a ratio of said reference received power over said incident power density, said calibration factor being determined as a ratio of a product of said on-body antenna aperture and said predetermined mass over said absorption cross section.

4. The method according to claim 3, wherein determining the whole-body averaged specific absorption ratio of absorbed radio-frequency electromagnetic radiation in said person comprises dividing said received power by said calibration factor.

5. The method according to claim 4, wherein said absorption cross section is determined by calculating the difference of the inverse of the second reverberation time and the inverse of the first reverberation time, wherein said difference is multiplied by said predetermined volume and divided by a speed of propagation of electromagnetic radiation in said chamber.

6. The method according to claim 1, wherein said first reverberation time and/or said second reverberation time are determined as an inverse of a slope of a logarithm of said electromagnetic power detected by said radiofrequency receiver with respect to time, said inverse being multiplied by a constant factor.

7. The method according to claim 6, wherein said constant factor is minus ten divided by the natural logarithm of ten when said logarithm of said electromagnetic power corresponds to a decibel scale of said electromagnetic power.

8. The method according to claim 1, wherein measuring the received power on said radiofrequency antenna of said exposimeter comprises measuring said received power in an uncontrolled environment outside said chamber.

9. The method according to claim 1, further comprising storing said determined whole-body averaged specific absorption ratio in a memory integrated in said exposimeter.

10. The method according to claim 1, further comprising displaying said determined whole-body averaged specific absorption ratio on a display integrated in said exposimeter.

11. A system for determining a whole-body averaged specific absorption ratio of absorbed radio-frequency electromagnetic radiation in a person, the system comprising:
an exposimeter comprising at least one radiofrequency antenna for positioning on a body of said person;
at least one radiofrequency emitter and at least one radiofrequency receiver for installing in a chamber forming an electromagnetic cavity;
a processor configured for receiving an electromagnetic power as function of time and/or frequency from said radiofrequency receiver when installed in said chamber, and for obtaining a reference received power from said radiofrequency antenna of said exposimeter; and
a memory;
wherein said processor is programmed for determining a first reverberation time representative of a first decay of electromagnetic power and a free-space incident power density in said chamber when said person is absent from said chamber, said electromagnetic power being detected by said radiofrequency receiver in response to a radiofrequency emission by said radiofrequency emitter when said person is absent from said chamber;
wherein said processor is programmed for determining a second reverberation time representative of a second decay of said electromagnetic power in said chamber and simultaneously determining said reference received power received by said radiofrequency antenna of said exposimeter when said person is present in said chamber, said electromagnetic power being detected by said radiofrequency receiver in response to a radiofrequency emission by said radiofrequency emitter when said person is present in said chamber;
wherein said processor is further programmed for determining an absorption cross section of said person taking the first reverberation time, the second reverberation time and a predetermined volume of said chamber into account;
wherein said processor is further programmed for determining a calibration factor representative of an electromagnetic mass of said person, and storing said calibration factor in said memory, said calibration factor being representative of a ratio of a received power on said radiofrequency antenna of said exposimeter and the whole-body averaged specific absorption ratio of absorbed radio-frequency electromagnetic radiation in said person, wherein determining said calibration factor takes said reference received power, said incident power density, said absorption cross section and a predetermined mass of said person into account; and
wherein said processor is programmed for measuring a received power on said radiofrequency antenna of said exposimeter and determining the whole-body averaged specific absorption ratio of absorbed radio-frequency electromagnetic radiation in said person by applying said calibration factor.

12. The system according to claim 11, wherein said radiofrequency antenna of said exposimeter comprises a textile antenna.

13. The system according to claim 11, wherein said exposimeter further comprises wearable receiver electronics for measuring and/or processing and/or storing said received power and/or communicating with said processor.

14. The system according to claim 11, furthermore comprising said chamber having said radiofrequency emitter and said radiofrequency receiver installed therein, wherein both the emitter and the receiver are arranged in the far-field of a volume that said person will occupy in said chamber when determining said second reverberation time and said reference received power.

15. The system according to claim 11, wherein said processor is further programmed for determining an antenna aperture as a ratio of said reference received power over said incident power density, and for determining said calibration factor as a ratio of a product of said antenna aperture and said predetermined mass over said absorption cross section.

16. The system according to claim 11, further comprising an input device for receiving said predetermined mass and said predetermined volume as input and storing said input in said memory.

17. The system according to claim 11, wherein said processor is programmed for determining the whole-body averaged specific absorption ratio of absorbed radio-frequency electromagnetic radiation in said person by dividing said received power by said calibration factor.

18. The system according to claim 11, wherein said processor is programmed for determining said absorption cross section as the difference of the inverse of the second reverberation time and the inverse of the first reverberation time, wherein said difference is multiplied by said predetermined volume and divided by a speed of propagation of electromagnetic radiation in said chamber.

19. The system according to claim 11, wherein said processor is programmed for determining said first reverberation time and/or said second reverberation time as an inverse of a slope of a logarithm of said electromagnetic power detected by said radiofrequency receiver with respect to time, said inverse being multiplied by a constant factor.

20. The system according to claim 11, wherein said processor comprises at least one processing unit integrated in said exposimeter.

* * * * *